US012166459B2

(12) United States Patent
Chang et al.

(10) Patent No.: US 12,166,459 B2
(45) Date of Patent: ***Dec. 10, 2024

(54) VOLTAGE AMPLIFIER BASED ON CASCADED CHARGE PUMP BOOSTING

(71) Applicant: Taiwan Semiconductor Manufacturing Company, Ltd., Hsinchu (TW)

(72) Inventors: Chin-Ho Chang, Hsinchu (TW); Jaw-Juinn Horng, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/232,526

(22) Filed: Aug. 10, 2023

(65) Prior Publication Data

US 2023/0421124 A1    Dec. 28, 2023

Related U.S. Application Data

(63) Continuation of application No. 17/085,781, filed on Oct. 30, 2020, now Pat. No. 11,784,617.

(51) Int. Cl.
*H03F 3/45*       (2006.01)
*G11C 7/12*       (2006.01)
*H03M 1/38*       (2006.01)

(52) U.S. Cl.
CPC .......... *H03F 3/45076* (2013.01); *G11C 7/12* (2013.01); *H03M 1/38* (2013.01); *H03F 2203/45156* (2013.01)

(58) Field of Classification Search
CPC ....... H03F 3/45076; H03F 2203/45156; H03F 2203/45514; H03F 2203/45551;
(Continued)

(56) References Cited

U.S. PATENT DOCUMENTS 5,359,294 A   10/1994  Ganger et al.
9,014,398 B2   4/2015  Onishi
(Continued)

FOREIGN PATENT DOCUMENTS

TW      I699765 B      7/2020

OTHER PUBLICATIONS

Ex Parte Quayle Action on U.S. Appl. No. 17/085,781 DTD Mar. 24, 2023.
(Continued)

*Primary Examiner* — Jung Kim
(74) *Attorney, Agent, or Firm* — FOLEY & LARDNER LLP

(57) ABSTRACT

Disclosed herein are related to a system and a method of amplifying an input voltage based on cascaded charge pump boosting. In one aspect, first electrical charges are stored at a first capacitor according to the input voltage to obtain a second voltage. In one aspect, the second voltage is amplified according to the first electrical charges stored by the first capacitor to obtain a third voltage. In one aspect, second electrical charges are stored at the second capacitor according to the third voltage. In one aspect, the third voltage is amplified according to the second electrical charges stored by the second capacitor to obtain a fourth voltage.

20 Claims, 11 Drawing Sheets

(58) Field of Classification Search
CPC .......... H03F 1/34; H03F 3/45475; H03F 3/45;
G11C 7/12; G11C 2207/002; G11C
2207/005; G11C 7/062; G11C 7/067;
G11C 7/16; G11C 11/54; H03M 1/38;
H03M 1/124; H03M 1/129
See application file for complete search history.

(56) References Cited

U.S. PATENT DOCUMENTS

| | | |
|---|---|---|
| 9,521,342 B2 | 12/2016 | Mesgarani |
| 11,784,617 B2 * | 10/2023 | Chang ................. H03F 3/45076 330/252 |
| 2013/0050003 A1 | 2/2013 | Wang |

OTHER PUBLICATIONS

Notice of Allowance on U.S. Appl. No. 17/085,781 DTD Jul. 5, 2023.

* cited by examiner

VOLTAGE AMPLIFIER BASED ON CASCADED CHARGE PUMP BOOSTING

CROSS-REFERENCE TO RELATED APPLICATION

This application is a continuation of U.S. patent application Ser. No. 17/085,781, filed Oct. 30, 2020, and titled "VOLTAGE AMPLIFIER BASED ON CASCADED CHARGE PUMP BOOSTING," the entire contents of which are incorporated herein by reference for all purposes.

BACKGROUND

Many electronic devices can include a voltage amplifier to process a small signal. A voltage amplifier can amplify a voltage of an input signal to obtain an amplified signal having a larger voltage than the voltage of the input signal. By obtaining an amplified signal, an additional processing can be performed. For example, an analog processing or a digital processing can be performed on the amplified signal having a larger voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
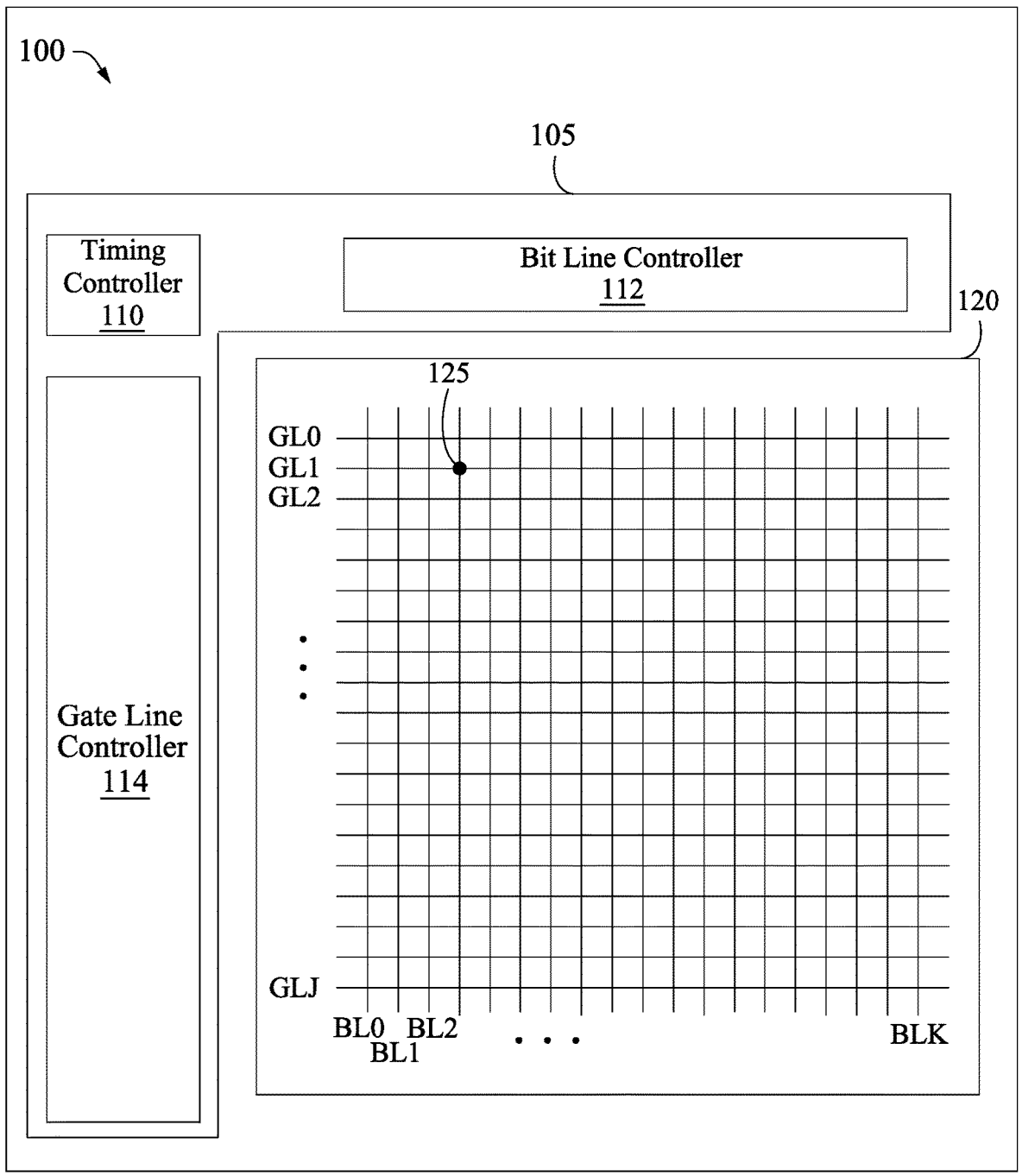
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a system and a method of amplifying an input voltage based on cascaded charge pump boosting. In one aspect, first electrical charges are stored at a first capacitor according to the input voltage to obtain a second voltage. In one aspect, the second voltage is amplified according to the first electrical charges stored by the first capacitor to obtain a third voltage. In one aspect, second electrical charges are stored at a second capacitor according to the third voltage. In one aspect, the third voltage is amplified according to the second electrical charges stored by the second capacitor to obtain a fourth voltage.

Beneficially, the disclosed voltage amplifier can achieve several advantages. In one aspect, accurate voltage amplification can be achieved by implementing a differential amplifier, two capacitors and a set of switches. In one aspect, the disclosed voltage amplifier can implement two capacitors for cascaded charge pump boosting, such that a large number of capacitors (e.g., three or more) for voltage amplification can be omitted. By reducing a number of capacitors implemented, an area efficiency can be achieved and a signal to noise ratio (SNR) can be improved. In one aspect, the disclosed voltage amplifier can implement the differential amplifier arranged to operate as a unity gain buffer having a simple configuration that may consume less power than a complex high gain amplifier (e.g., operation amplifier). By reusing a single differential amplifier charge pump boosting, area efficiency can be achieved.

Disclosed herein are related to a system and a method of generating an input voltage according to input data with degradations due to parasitic capacitances. In one aspect, a set of capacitors can store charges corresponding to an input voltage. In one aspect, each of the set of capacitors may be connected to a corresponding switch that allows the each of the set of capacitors to selectively couple to i) a corresponding bit line or ii) to one or more other capacitors of the set of capacitors. In some embodiments, the set of capacitors may be connected to an amplifier that may reduce electrical charges stored by the parasitic capacitances associated with the switches. By reducing the electrical charges due to the parasitic capacitances, a signal linearity can be improved, thereby allowing a subsequent process (e.g., analog processing or digital processing) to be performed in an efficient and accurate manner. In one aspect, the differential amplifier used for charge pump boosting can be utilized to compensate for electrical charges due to the parasitic capacitances. By reusing the same differential amplifier, an area efficiency can be achieved.

Although the voltage amplifier disclosed herein is implemented for a memory system storing multi-bit data, the voltage amplifier disclosed herein can be applied to any electronic device or system (e.g., communication device or sensing device) to amplify a voltage of an input signal.

FIG. 1 is a diagram of a memory system 100, in accordance with one embodiment. In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL (or a word line WL) and a corresponding bit line BL. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of memory cells 125. The memory array 120 includes gate lines GL0, GL1 . . . GLJ, each extending in a first direction (e.g., X-direction) and bit lines BL0, BL1 . . . BLK, each extending in a second direction (e.g., Y-direction). The gate lines GL and the bit lines BL may be conductive metals or conductive rails. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 may be a ferroelectric field-effect transistor (FeFET), resistive memory cell, a non-volatile memory cell, or a volatile memory cell. In some embodiments, the memory array 120 includes additional lines (e.g., select lines, reference lines, reference control lines, power rails, etc.). The memory array 120 may store weight data or bias data for constructing a neural network. Detailed descriptions on configurations and operations of the memory system 100 are provided below with respect to FIGS. 2 through 10.

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120, and the bit line controller 112 is a circuit that provides or senses a voltage or current through one or more bit lines BL and/or select lines SL of the memory array 120. In one configuration, the timing controller 110 is a circuit that provides control signals or clock signals to synchronize operations of the bit line controller 112 and the gate line controller 114. The bit line controller 112 may be connected to bit lines BL and/or select lines SL of the memory array 120, and the gate line controller 114 may be connected to gate lines GL of the memory array 120. In one example, to write data to a memory cell 125, the gate line controller 114 provides a voltage or current to the memory cell 125 through a gate line GL connected to the memory cell 125, and the bit line controller 112 applies a bias voltage to the memory cell 125 through a bit line BL and/or a select line SL connected to the memory cell 125. In one example, to read data from a memory cell 125, the gate line controller 114 provides a voltage or current to the memory cell 125 through a gate line GL connected to the memory cell 125, and the bit line controller 112 senses a voltage or current corresponding to data stored by the memory cell 125 through a bit line BL and/or a select line SL connected to the memory cell 125. In some embodiments, the memory controller 105 includes more, fewer, or different components than shown in FIG. 1.

Figure 2:
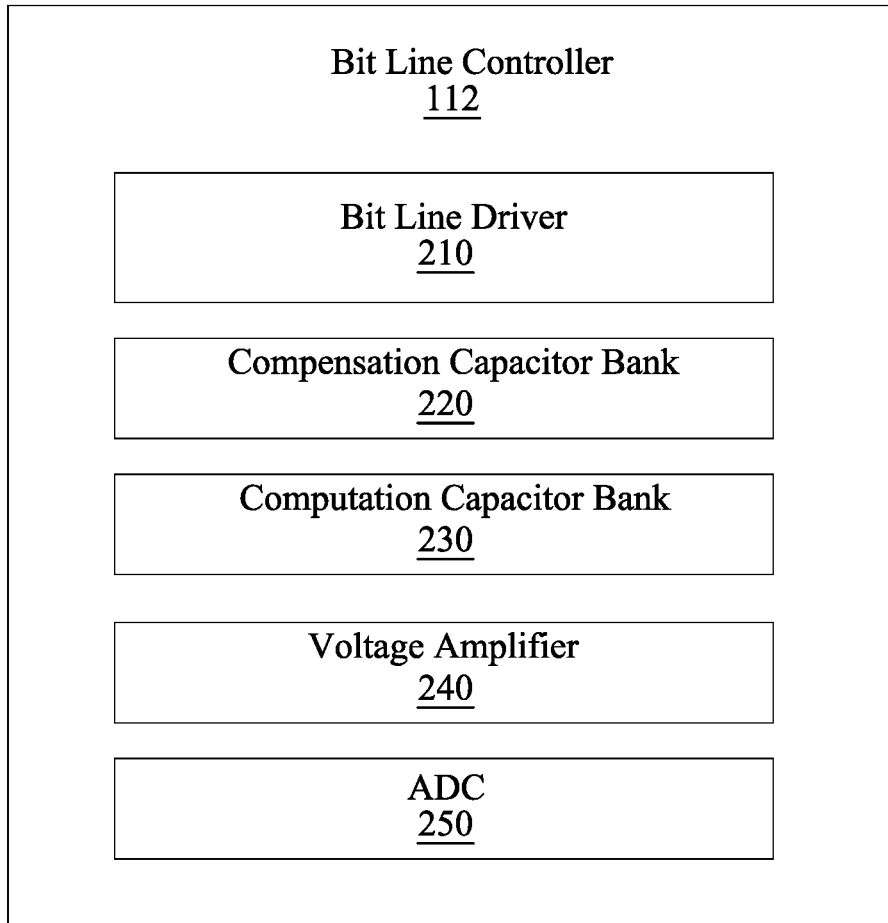
FIG. 2 is a diagram of a bit line controller, in accordance with one embodiment.

FIG. 2 is a diagram of the bit line controller 112, in accordance with one embodiment. In some embodiments, the bit line controller 112 includes a bit line driver 210, a compensation capacitor bank 220, a computation capacitor bank 230, a voltage amplifier 240, and an analog to digital converter (ADC) 250. These components may operate together to read multi-bit data stored by a set of memory cells 125. In one aspect, the multi-bit data stored by the set of memory cells 125 correspond to weight data or bias data for constructing a neural network. In some embodiments, the bit line controller 112 includes more, fewer, or less components than shown in FIG. 2.

In some embodiments, the bit line driver 210 is a circuit or a hardware component, and provides one or more voltages or currents, and provides the voltages or currents to the set of bit lines BL or select lines SL connected to the set of memory cells 125. To write one bit of multi-bit data at a memory cell 125, the bit line driver 210 may apply a voltage or a current corresponding to one-bit data to a bit line BL or a select line SL coupled to the memory cell 125. Accordingly, each of the set of memory cells 125 can store a different bit of data. To read multi-bit data from a set of memory cells 125, the bit line driver 112 may also simultaneously or sequentially apply a voltage or a current to bit lines BL or select lines SL coupled to the set of memory cells 125. In response to the voltage or current applied through the bit lines BL or select lines SL, the set of memory cells 125 may output voltages or currents corresponding to the stored data.

In some embodiments, the computation capacitor bank 230 is a circuit or a hardware component that stores electrical charges corresponding to multi-bit data stored by the set of memory cells 125. In one aspect, the computation capacitor bank 230 includes a set of capacitors coupled to the set of bit lines BL (or select lines SL). The set of capacitors of the computation capacitor bank 230 may have weighted capacitances. Each capacitor of the set of capacitors may have a size or a capacitance associated with a corresponding bit. For example, a first capacitor of the set of capacitors may have a largest capacitance among the set of capacitors, and each subsequent capacitor may have a smaller capacitance than its preceding capacitor. Accordingly, the first capacitor may store electrical charges corresponding to most significant bit (MSB) of multi-bit data, according to a voltage or current provided through the corresponding bit line BL or select line SL. Each subsequent capacitor may store electrical charges corresponding to a subsequent bit of the multi-bit data, according to a voltage or current provided through the corresponding bit line BL or select line SL. Based on electrical charges stored by the computation capacitor bank 230, multi-bit data stored by the set of memory cells 125 can be read.

In some embodiments, the compensation capacitor bank 220 is a circuit or a hardware component that provides even capacitive loading at the bit lines BL or select lines SL. In one aspect, the compensation capacitor bank 220 includes a set of capacitors coupled to the set of bit lines BL (or select lines SL). The set of capacitors of the compensation capacitor bank 220 may have weighted capacitances that allow each bit line BL (or select line SL) to have the same total capacitance. For example, a total capacitance of a first bit line BL coupled to i) a first capacitor of the computation capacitor bank 230 and ii) a first capacitor of the compensation capacitor bank 220 is same as or substantially close to a total capacitance of a second bit line BL coupled to i) a second capacitor of the computation capacitor bank 230 and ii) a second capacitor of the compensation capacitor bank 220. By implementing the compensation capacitor bank 220, the set of memory cells 125 may have even capacitive loadings.

In some embodiments, the voltage amplifier 240 is a circuit or a hardware component that amplifies an input voltage at the computation capacitor bank 230 through cascaded charge pump boosting. In one aspect, the voltage amplifier 240 includes a first capacitor, a second capacitor, a differential amplifier, and a set of switches. The differential amplifier may be arranged to operate as a unity gain buffer. The set of switches may be configured according to various pulses from a controller (e.g., timing controller 110). In one approach, the voltage amplifier 240 may store first electrical charges at the first capacitor according to the input voltage to obtain a second voltage. The voltage amplifier 240 may amplify the second voltage according to the first electrical charges stored by the first capacitor to obtain a third voltage. The voltage amplifier 240 may store second electrical charges at the second capacitor according to the third voltage. The voltage amplifier 240 may amplify the third voltage according to the second electrical charges stored by the second capacitor to obtain a fourth voltage. The voltage amplifier 240 may provide the fourth voltage to the ADC 250. Through cascaded charge pump boosting, the voltage amplifier 240 can achieve high voltage gain with a simple architecture. Detailed descriptions on implementations and operations of the voltage amplifier 240 are provided below with respect to FIGS. 4 through 10.

In some embodiments, the ADC 250 is a circuit or a hardware component that converts a voltage provided from the voltage amplifier 240 into multi-bit digital data. The ADC 250 may be implemented as successive-approximation register (SAR) ADC. The ADC 250 may be implemented as any component that can convert an analog voltage into corresponding digital data.

In one aspect, a voltage sampled according to a least significant bit (LSB) of multi-bit data stored by the set of memory cells 125 may be low, such that the ADC 250 may not successfully convert the voltage to obtain the LSB. For example, a memory cell 125 of the computation capacitor bank 230 corresponding to a least significant bit (LSB) may be 10~100 femtofarads (fF), and a voltage attributed to such small capacitance may be 10~50 mV. To convert such small voltage into a corresponding digital data, the ADC 250 may be implemented with a complicated architecture that may consume excessive power. By implementing the voltage amplifier 240 between the computation capacitor bank 230 and the ADC 250, the ADC 250 may process an amplified voltage from the voltage amplifier 240. Accordingly, the ADC 250 can be implemented with a simpler architecture with less power consumption.

Figure 3:
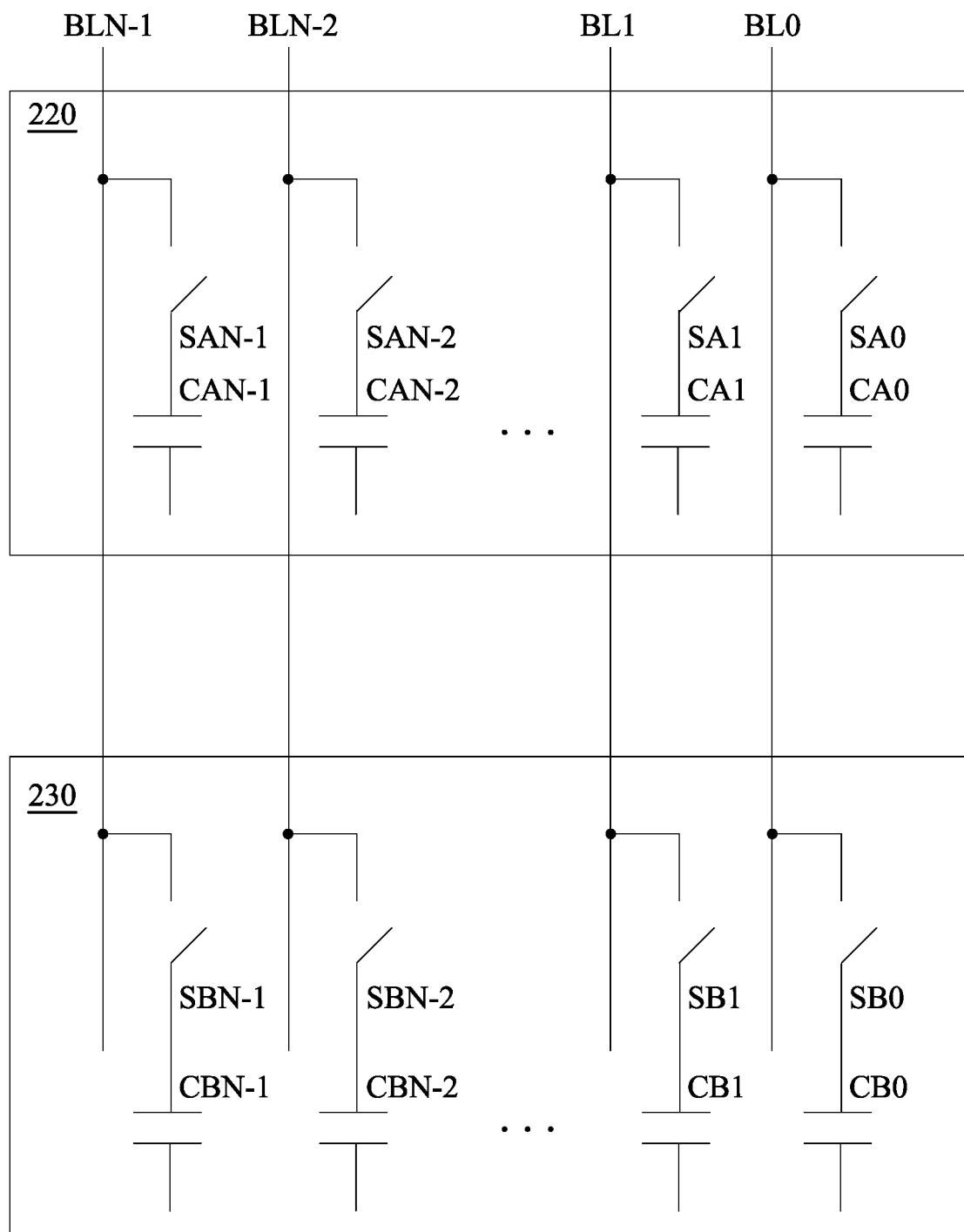
FIG. 3 is a diagram showing compensation capacitors and computation capacitors, in accordance with one embodiment.

FIG. 3 is a diagram showing the compensation capacitor bank 220 and the computation capacitor bank 230, in accordance with one embodiment. In some embodiments, the compensation capacitor bank 220 includes a set of capacitors CA0, CA1 ... CAN-1, and a set of switches SA0, SA1 ... SAN-1. In some embodiments, the computation capacitor bank 230 includes a set of capacitors CB0, CB1 ... CBN-1, and a set of switches SB0, SB1 ... SBN-1. The set of switches SA0, SA1 ... SAN-1 and the set of switches SB0, SB1 ... SBN-1 can be embodied as transistors or any components that can selectively couple two or more components. In one configuration, each capacitor CAX and a corresponding switch SAX are connected to each other in series, and each capacitor CBX and a corresponding switch SBX are connected to each other in series. Moreover, a first series connection of i) a capacitor CAX and ii) a corresponding switch SAX and a second series connection of i) a capacitor CBX and ii) a corresponding switch SBX are connected to a corresponding bit line BLX. In one aspect, a controller (e.g., timing controller 110) can generate voltages or pulses to control switches SAX, SBX to electrically couple capacitors CAX, CBX to a corresponding bit line BLX. The controller may generate a common pulse and provide the common pulse to the set of switches SA0, SA1 ... SAN-1 and the set of switches SB0, SB1 ... SBN-1, such that the set of capacitors CA0, CA1 ... CAN-1 and the set of capacitors CB0, CB1 ... CBN-1 can be electrically coupled to respective bit lines BL0, BL1 ... BLN-1 simultaneously. Additionally or alternatively, the controller may generate separate pulses to configure the set of switches SA0, SA1 ... SAN-1 and the set of switches SB0, SB1 ... SBN-1 separately or sequentially.

In one aspect, the set of capacitors CA0, CA1 ... CAN-1 and the set of capacitors CB0, CB1 ... CBN-1 have weighted capacitances. An Xth capacitor CBX may have a capacitance $C_{unit} \times 2^X$, where $C_{unit}$ is a unit capacitance. An Xth capacitor CAX may have a capacitance $C_{bitline} - C_{unit} \times 2^X$, where $C_{bitline}$ is a total capacitance at a bit line BLX. Hence, each of the set of capacitors CB0, CB1 ... CBN-1 can have a different capacitance according to a corresponding bit of multi-bit data, while each of the bit lines BL0, BL1 ... BLN-1 can have the same total capacitance.

Figure 4:
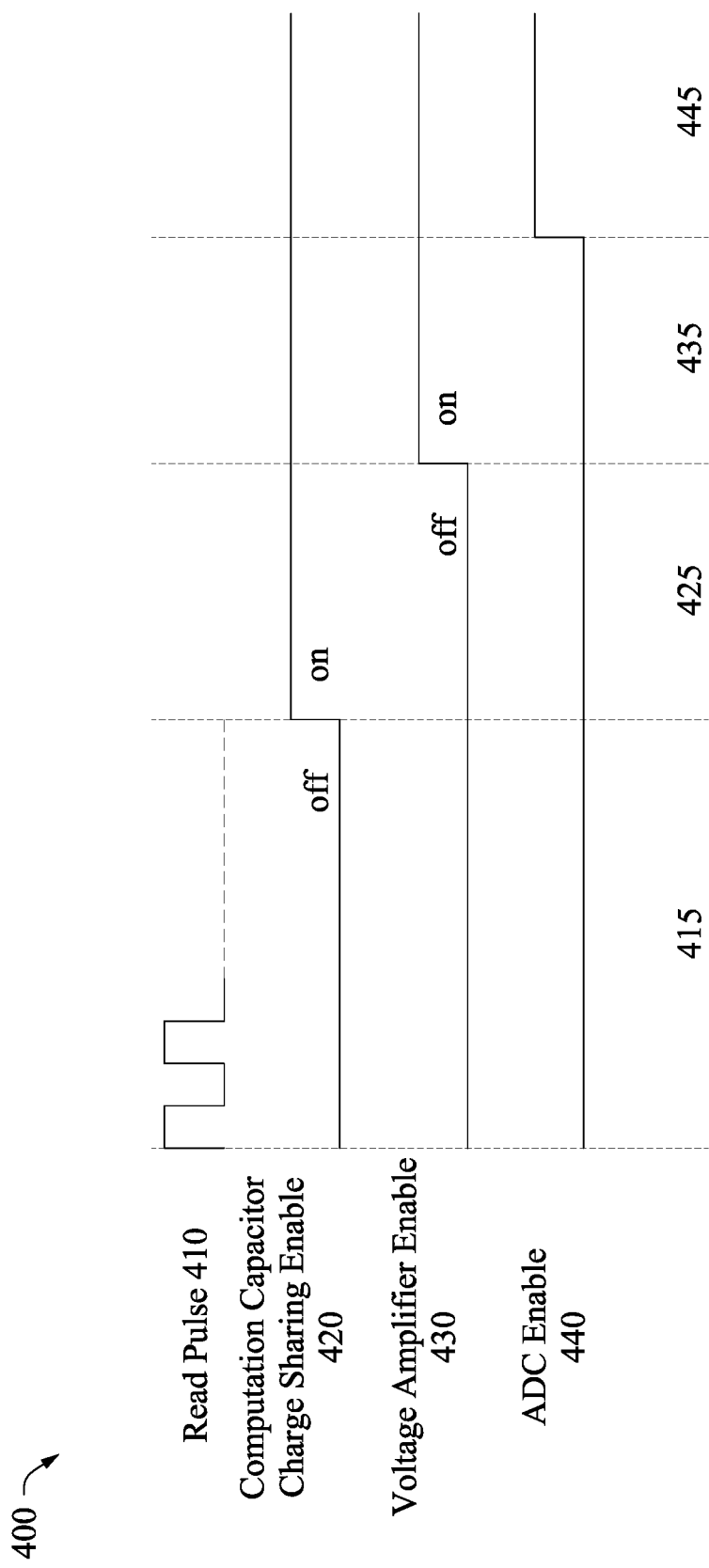
FIG. 4 is a timing diagram showing an example operation of a bit line controller, in accordance with one embodiment.

FIG. 4 is a timing diagram 400 showing an example operation of the bit line controller 112, in accordance with one embodiment. In some embodiments, a controller (e.g., timing controller 110) may generate pulses 410, 420, 430, 440, and provide the pulses 410, 420, 430, 440 to the bit line controller 112. The controller may apply the pulses 410, 420, 430, 440 during four different time periods 415, 425, 435, 445. During the time period 415, the bit line controller 112 may perform sampling of voltages corresponding to multi-bit data. During the time period 425, the bit line controller 112 may perform charge sharing. During the time period 435, the bit line controller 112 may perform voltage amplification. During the time period 445, the bit line controller 112 may perform analog to digital conversion. Through the operations performed during the time periods 415, 425, 435, 445, multi-bit data stored by the set of memory cells 125 can be retrieved and processed.

During the time period 415, the controller may configure or cause the bit line controller 112 to sample voltages corresponding to multi-bit data stored by a set of memory cells 125. During the time period 415, the read pulses 410 may toggle between logic state '0' and logic state '1'. During the time period 415, the controller may generate read pulses 410, and apply the read pulses 410 to the gate line controller 114, the bit line controller 112, or both. In response to the read pulses 410, the gate line controller 114 may apply pulses corresponding to or synchronized with the read pulses 410 to a word line or a control line connected to the set of memory cells 125. Similarly, in response to the read pulses 410, the bit line controller 112 (e.g., bit line driver 210) may apply pulses corresponding to or synchronized with the read pulses 410 to bit lines or sense lines connected to the set of memory cells 125. The bit line controller 112 may apply the pulses to different bit lines or sense lines simultaneously or sequentially. In response to the pulses applied by the gate line controller 114, the bit line controller 112 or both, the set of memory cells 125 may output voltages or currents, according to logic states or bits stored. For example, in response to a read pulse 410, a first memory cell 125 storing a logic state '1' may output a higher voltage (e.g., 550 mV) than a second memory cell 125 storing a logic state '0' (e.g., 150 mV). During the time period 415, the pulses 420, 430, 440 may have logic state '0'.

In one approach, the bit line controller 112 can store electrical charges according to voltages from the set of memory cells 125 through the bit lines BL. As described above with respect to FIG. 2, capacitors of the computation capacitor bank 230 may have weighted capacitances. Accordingly, each capacitor of the computation capacitor bank 230 may store different amount of electrical charges according to its capacitance. For example, in response to a voltage corresponding to a logic state '1' applied through a bit line BL3 connected to a fourth memory cell for storing MSB, the fourth capacitor may store electrical charges corresponding to $2^3 \times C_{unit}$. Meanwhile, in response to a voltage corresponding to a logic state '1' applied through another bit line BL0 connected to a first memory cell for storing LSB, the first capacitor may store electrical charges corresponding to $2^0 \times C_{unit}$.

During the time period 425, the controller may configure or cause the bit line controller 112 to perform charge sharing based on the voltage sampled during the time period 415. During the time period 425, the controller may generate the computation capacitor charge sharing enable pulse 420 having a logic state '1', and provide the pulse 420 to the bit line controller 112. In response to the computation capacitor charge sharing enable pulse 420 having the logic state '1', the bit line controller 112 may couple each of the set of capacitors with the others of the set of capacitors, such that the set of capacitors can share electrical charges among each other. The amount of electrical charges collectively stored may indicate or correspond to multi-bit data stored. Assuming that a set of memory cells 125 stores data [1001], the set of capacitors may collectively store electrical charges corresponding to $9 \times C_{unit}$. Assuming that a set of memory cells 125 stores data [0011], the set of capacitors may collectively store electrical charges corresponding to $3 \times C_{unit}$. The set of memory cells 125 may have or generate a voltage corresponding to the total electrical charges shared. In one aspect, the voltage at the set of memory cells 125 can be represented as below:

$$V = Q_{total} / \Sigma_{i=0}^{N-1} 2^i \times C_{unit})$$ Eq. (1)

where V is the voltage at the set of capacitors, $Q_{total}$ is the total electrical charges shared by the set of capacitors, and N is a number of bits of multi-bit data. During the time period 425, the pulses 410, 430, 440 may have logic state '0'.

During the time period 435, the controller may configure or cause the bit line controller 112 to amplify the voltage at the set of capacitors of the computation capacitor bank 230. During the time period 435, the controller may generate the voltage amplifier enable pulse 430 having a logic state '1', and provide the pulse 430 to the bit line controller 112. In response to the voltage amplifier enable pulse 430 having the logic state '1', the bit line controller 112 (e.g., voltage amplifier 240) may amplify the voltage at the set of capacitors. In one aspect, the bit line controller 112 performs voltage amplification based on cascaded charge pump boosting. During the time period 435, the pulses 410, 440 may have logic state '0', while the pulses 420, 430 may have logic state '1'.

During the time period 445, the controller may configure or cause the bit line controller 112 to perform analog to digital conversion. During the time period 445, the controller may generate the ADC enable pulse 440 having a logic state '1', and provide the pulse 440 to the bit line controller 112. In response to the ADC enable pulse 440 having the logic state '1', the bit line controller 112 (e.g., ADC 250) may perform analog to digital conversion on the amplified voltage obtained during the time period 435. In one aspect, the amplified voltage allows the analog to digital conversion to be performed in an accurate manner. During the time period 445, the pulses 410 may have logic state '0', while the pulses 420, 430, 440 may have logic state '1'.

Figure 5:
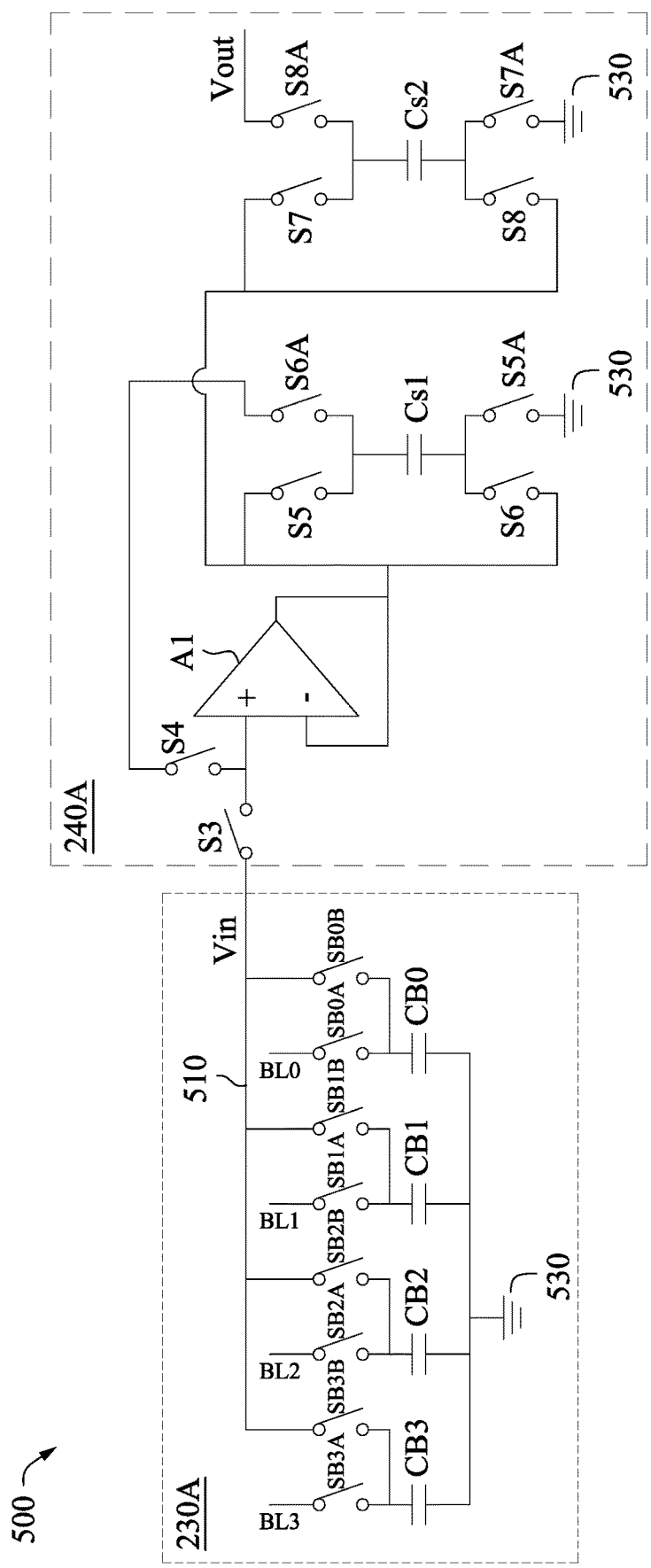
FIG. 5 is a circuit diagram showing a computation capacitor bank and a voltage amplifier, in accordance with one embodiment.

FIG. 5 is a circuit diagram 500 showing the computation capacitor bank 230A and a voltage amplifier 240A, in accordance with one embodiment. In one configuration, the computation capacitor bank 230A is coupled to bit lines BL0-BL3 to receive voltages or currents corresponding to multi-bit data stored by a set of memory cells 125. In one configuration, the computation capacitor bank 230A generates an input voltage Vin at a common metal rail 510 according to the voltages or currents from the bit lines BL0-BL3. The computation capacitor bank 230A may provide the input voltage Vin to the voltage amplifier 240A. The voltage amplifier 240A may amplify the input voltage Vin to generate an output voltage Vout. The voltage amplifier 240A may provide the output voltage Vout to the ADC 250.

In some embodiments, the computation capacitor bank 230A is a circuit or a hardware component that can receive voltages or currents corresponding to multi-bit data stored by a set of memory cells 125 and generate the input voltage Vin according to the received voltages or currents. In some embodiments, the computation capacitor bank 230A includes a set of switches SB0A-SB3A, a set of switches SB0B-SB3B, and a set of capacitors CB0-CB3. The set of switches SB0A-SB3A and the set of switches SB0B-SB3B may be embodied as transistors or any components that can selectively couple two or more components. The set of switches SB0A-SB3A may correspond to the set of switches SB0-SB3 in FIG. 3. In some embodiments, the computation capacitor bank 230A includes more, fewer, or different components than shown in FIG. 5. In some embodiments, the computation capacitor bank 230A is replaced by a different circuit or component that can perform the functionality of the computation capacitor bank 230A disclosed herein. In one configuration, each switch SBXA includes a first electrode connected to a respective bit line BLX, and a second electrode connected to a first electrode of a corresponding capacitor CBX. In one configuration, each switch SBXB includes a first electrode connected to the common metal rail 510, and a second electrode connected to the first electrode of the corresponding capacitor CBX. In one configuration, each capacitor CBX includes a second electrode connected to a reference metal rail 530, at which a reference voltage (e.g., ground voltage) can be provided.

In one aspect, the set of switches SB0A-SB3A and the set of switches SB0B-SB3B may be configured to sample voltages or currents at the bit lines BL0-BL3, and perform charge sharing to generate the input voltage Vin at the common metal rail 510. The set of switches SB0A-SB3A and the set of switches SB0B-SB3B may operate or be configured according to voltages or pulses from a controller (e.g., timing controller 110). For example, in response to a voltage corresponding to logic state '1' applied to gate electrodes of the set of switches SB0A-SB3A, each of the set of switches SB0A-SB3A may electrically couple a corresponding bit line of the bit lines BL0-BL3 to a first electrode of a corresponding capacitor of the set of capacitors CB0-CB3. For example, in response to a voltage corresponding to logic state '0' applied to gate electrodes of the set of switches SB0A-SB3A, each of the set of switches SB0A-SB3A may electrically decouple the corresponding bit line of the bit lines BL0-BL3 from the first electrode of the corresponding capacitor of the set of capacitors CB0-CB3. Similarly, in response to a voltage corresponding to logic state '1' applied to gate electrodes of the set of switches SB0B-SB3B, each of the set of switches SB0B-SB3B may electrically couple a first electrode of the corresponding capacitor of the set of capacitors CB0-CB3 to the common metal rail 510. For example, in response to a voltage corresponding to logic state '0' applied to gate electrodes of the set of switches SB0B-SB3B, each of the set of switches SB0B-SB3B may electrically decouple the first electrode of the corresponding capacitor of the set of capacitors CB0-CB3 from the common metal rail 510.

In one aspect, the set of switches SB0A-SB3A and the set of switches SB0B-SB3B are configured differentially to perform sampling and charge sharing. For example, the set of switches SB0A-SB3A may simultaneously couple the bit lines BL0-BL3 to the capacitors CB0-CB3, while the set of switches SB0B-SB3B may decouple the capacitors CB0-CB3 from the common metal rail 510 during the time period 425. For example, the set of switches SB0B-SB3B may simultaneously couple the capacitors CB0-CB3 to the common meal rail, while the set of switches SB0A-SB3A may decouple the bit lines BL0-BL3 from the capacitors CB0-CB3 during the time period 435. Hence, the set of capacitors CB0-CB3 may store electrical charges according to voltages or currents at the bit lines BL0-BL3 during the time period 425. Moreover, the set of capacitors CB0-CB3 may share electrical charges to generate the input voltage Vin at the common metal rail 510 during the time period 435.

In some embodiments, the voltage amplifier 240A is a circuit or a hardware component that can amplify the input voltage Vin to generate an output voltage Vout. In some embodiments, the voltage amplifier 240A includes a differential amplifier A1, capacitors Cs1, Cs2, and a plurality of switches S3, S4, S5, S5A, S6, S6A, S7, S7A, S8, S8A. The plurality of switches S3, S4, S5, S5A, S6, S6A, S7, S7A, S8, S8A may be embodied as transistors or any components that can selectively couple two or more components. The capacitors Cs1, Cs2 may have same or different capacitances. These components may operate together to amplify the input voltage Vin to generate an output voltage Vout through cascaded charge pump boosting. In some embodiments, the voltage amplifier 240A is replaced by a different circuit or a different component that can perform the functionality of the voltage amplifier 240A described herein. In some embodiments, the voltage amplifier 240A includes more, fewer, or different components than shown in FIG. 5. In some embodiments, the capacitor Cs2 may be shared with or implemented as part of the ADC 250 or a different component.

In one configuration, the switch S3 includes a first electrode connected to the common metal rail 510 of the computation capacitor bank 230A to receive the input voltage Vin, and a second electrode connected to a first input port (e.g., "+" input port) of the differential amplifier A1. In one configuration, the switch S4 includes a first electrode connected to the first input port (e.g., "+" input port) of the differential amplifier A1, and a second electrode connected to a first electrode of the switch S6A. In one configuration, the differential amplifier A1 includes a second input port (e.g., "−" input port) connected to an output port of the differential amplifier A1, such that the differential amplifier A1 is arranged or operates as a unity gain buffer.

In one configuration, a first electrode of the switch S6 is connected to the output port of the differential amplifier A1, and a second electrode of the switch S6 is connected to a first electrode of the capacitor Cs1. In one configuration, a first electrode of the switch S5A is connected to the first electrode of the capacitor Cs1, and a second electrode of the switch S5A is connected to the reference metal rail 530. In one configuration, a first electrode of the switch S5 is connected to the output port of the differential amplifier A1, and a second electrode of the switch S5 is connected to a second electrode of the capacitor Cs1. In one configuration, a second electrode of the switch S6A is connected to the second electrode of the capacitor Cs1.

In one configuration, a first electrode of the switch S8 is connected to the output port of the differential amplifier A1, and a second electrode of the switch S8 is connected to a first electrode of the capacitor Cs2. In one configuration, a first electrode of the switch S7A is connected to the first electrode of the capacitor Cs2, and a second electrode of the switch S7A is connected to the reference metal rail 530. In one configuration, a first electrode of the switch S7 is connected to the output port of the differential amplifier A1, and a second electrode of the switch S7 is connected to a second electrode of the capacitor Cs2. In one configuration, a first electrode of the switch S8A is connected to an output metal rail, at which the output voltage Vout can be provided, and a second electrode of the switch S8A is connected to the second electrode of the capacitor Cs2.

In this configuration, the plurality of switches S3, S4, S5, S5A, S6, S6A, S7, S7A, S8, S8A may receive voltages or pulses from a controller (e.g., timing controller 110) and amplifies the input voltage Vin to generate the output voltage Vout through cascaded charge pump boosting. In one aspect, a set of switches S3, S4 can be differentially configured to selectively couple the first input port (e.g., "+" input port) of the differential amplifier A1 to i) the computation capacitor bank 230A or ii) the switch S6A. In one aspect, a set of switches S6, S5A can be differentially configured to selectively couple the first electrode of the capacitor Cs1 to i) the output port of the differential amplifier A1 or ii) the reference metal rail 530. In one aspect, a set of switches S5, S6A can be differentially configured to selectively couple the second electrode of the capacitor Cs1 to i) the output port of the differential amplifier A1 or ii) the switch S4. In one aspect, a set of switches S8, S7A can be differentially configured to selectively couple the first electrode of the capacitor Cs2 to i) the output port of the differential amplifier A1 or ii) the reference metal rail 530. In one aspect, a set of switches S7, S8A can be differentially configured to selectively couple the second electrode of the capacitor Cs2 to i) the output port of the differential amplifier A1 or ii) the output metal rail. Example operations of the computation capacitor bank 230A and the voltage amplifier 240A are provided below with respect to FIG. 6.

Figure 6:
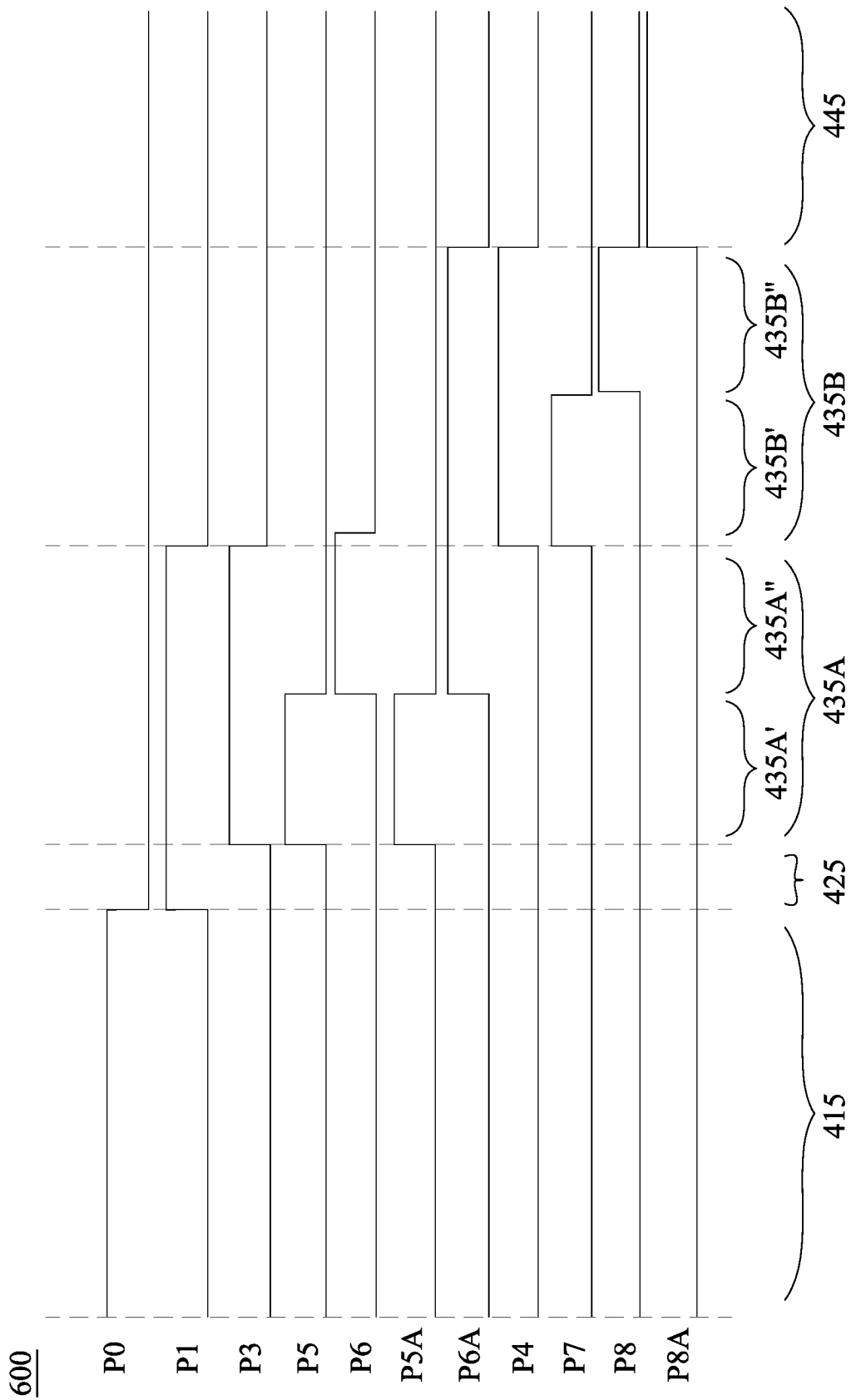
FIG. 6 is a timing diagram showing an example operation of a computation capacitor bank and a voltage amplifier, in accordance with one embodiment.

FIG. 6 is a timing diagram 600 showing an example operation of the computation capacitor bank 230A and the voltage amplifier 240A, in accordance with one embodiment. In one aspect, a controller (e.g., timing controller 110) can generate various pulses P0, P1, P3, P5, P6, PSA, P6A, P4, P7, P8, P8A and apply the pulses P0, P1, P3, P5, P6, PSA, P6A, P4, P7, P8, P8A to the switches of the computation capacitor bank 230A and the voltage amplifier 240A.

In one approach, the pulse P0 is applied to gate electrodes of the switches SB0A-SB3A, and the pulse P1 is applied to gate electrodes of the switches SB0B-SB3B. In one approach, the pulse P3 is applied to a gate electrode of the switch S3; the pulse P5 is applied to a gate electrode of the switch S5; the pulse P6 is applied to a gate electrode of the switch S6; the pulse P5A is applied to a gate electrode of the switch S5A; the pulse P6A is applied to a gate electrode of the switch S6A; the pulse P8 is applied to gate electrode of the switch S8; and the pulse P8A is applied to the gate electrode of the switch S8A. In one approach, the pulse P7 is applied to gate electrodes of the switches S7 and S7A.

During the time period 415, the pulse P0 may have a first state (e.g., logic state '1') to sample voltages or currents at the bit lines BL0-BL3. In response to the pulse P0 having the first state (e.g., logic state '1'), the set of switches SB0A-SB3A can be enabled to electrically couple the bit lines BL0-BL3 to the capacitors CB0-CB3, respectively. In response to the pulse P1 having a second state (e.g., logic state '0'), the set of switches SB0B-SB3B can be disabled to electrically decouple the common metal rail 510 from the capacitors CB0-CB3. Accordingly, the set of capacitors CB0-CB3 may store electrical charges corresponding to voltages or currents corresponding multi-bit data stored by the set of memory cells 125. During the time period 415, the pulses P3, P5, P6, P5A, P6A, P4, P7, P8, P8A may have a second state (e.g., logic state '0'), such that other switches S3, S5, S6, S5A, S6A, S4, S7, S7A, S8, S8A may be disabled.

During the time period 425, the pulse P1 may have a first state (e.g., logic state '1') and the pulse P0 may have a second state (e.g., logic state '0') to perform charge sharing. In response to the pulse P1 having the first state (e.g., logic state '1'), the set of switches SB0B-SB3B can be enabled to electrically couple the common metal rail 510 to the capacitors CB0-CB3. In response to the pulse P0 having the second state (e.g., logic state '0'), the set of switches SB0A-SB3A can be disabled to electrically decouple the bit lines BL0-BL3 from the capacitors CB0-CB3. Accordingly, the set of capacitors CB0-CB3 can be electrically coupled among each other and share stored electrical charges. The set of capacitors CB0-CB3 may have or generate the input voltage Vin at the common metal rail 510, according to the shared electrical charges, as described above with respect to Eq. (1). During the time period 425, the pulses P3, P5, P6, P5A, P6A, P4, P7, P8, P8A may have a second state (e.g., logic state '0'), such that other switches S3, S5, S6, S5A, S6A, S4, S7, S7A, S8, S8A may be disabled.

During the time period 435A, the pulse P3 may have a first state (e.g., logic state '1'), while the pulse P1 may have the first state (e.g., logic state '1'). In response to the pulse P3 having the first state (e.g., logic state '1') and the pulse P1 having the first state (e.g., logic state '1'), the switch S3 and the set of switches SB0B-SB3B may be enabled to electrically couple the set of capacitors CB0-CB3 to the first input port of the differential amplifier A1. Accordingly, the differential amplifier A1 arranged or operating as a unity gain buffer may receive the input voltage Vin from the set of capacitors CB0-CB3 at the first input port and generate or output the input voltage Vin at its output port. During the time period 435A, the pulses P0, P4, P7, P8, P8A may have a second state (e.g., logic state '0'), such that other switches SB0A-SB3A, S4, S7, S7A, S8, S8A may be disabled.

During a first sub-time period 435A' within the time period 435A, the pulses P5, P5A may have a first state (e.g., logic state '1') while the pulses P6, P6A may have a second state (e.g., logic state '0'). In response to the pulses P5, P5A having the first state (e.g., logic state '1'), the switches S5, S5A may be enabled to electrically couple the first electrode of the capacitor Cs1 to the reference metal rail 530 and electrically couple the second electrode of the capacitor Cs1 to the output port of the differential amplifier A1. In response to the pulses P6, P6A having the second state (e.g., logic state '0'), the switches S6, S6A may be disabled to electrically decouple the first electrode of the capacitor Cs1 from the output port of the differential amplifier A1 and electrically decouple the second electrode of the capacitor Cs1 from the switch S4. Accordingly, the capacitor Cs1 may store electrical charges corresponding to the input voltage Vin during the first sub-time period 435A'.

During a second sub-time period 435A" within the time period 435A, the pulses P6, P6A may have a first state (e.g., logic state '1') while the pulses P5, P5A may have a second state (e.g., logic state '0'). In response to the pulses P6, P6A having the first state (e.g., logic state '1'), the switches S6, S6A may be enabled to electrically couple the first electrode of the capacitor Cs1 to the output port of the differential amplifier A1 and electrically couple the second electrode of the capacitor Cs1 to the switch S4. In response to the pulses P5, P5A having the second state (e.g., logic state '0'), the switches S5, S5A may be disabled to electrically decouple the first electrode of the capacitor Cs1 from the reference metal rail 530 and electrically decouple the second electrode of the capacitor Cs1 from the output port of the differential amplifier A1. In one aspect, the input voltage Vin can be applied to the first electrode of the capacitor Cs1 during the second sub-time period 435A". Meanwhile, the switch S4 is disabled during the second sub-time period 435A", such the second electrode of the capacitor Cs1 is electrically floated. Because the capacitor Cs1 maintains electrical charges, the voltage at the second electrode of the capacitor Cs1 can be increased to generate or obtain a first amplified voltage during the second sub-time period 435A" through charge pump boosting. For example, the voltage at the second electrode of the capacitor Cs1 can be doubled during the second sub-time period 435A".

During the time period 435B, the pulse P4 may have a first state (e.g., logic state '1') and the pulse P6A may have the first state (e.g., logic state '1'), while the pulse P3 may have the second state (e.g., logic state '0'). In response to the pulses P4, P6A having the first state (e.g., logic state '1'), the switches S4, S6A may be enabled to electrically couple the first input port of the differential amplifier A1 to the second electrode of the capacitor Cs1. In response to the pulse P3 having the second state (e.g., logic state '0'), the switch S3 may be disabled to electrically decouple the computation capacitor bank 230A from the first input port of the differential amplifier A1. Accordingly, the differential amplifier A1 arranged or operating as a unity gain buffer may receive the first amplified voltage from the first capacitor Cs1 at the first input port and generate or output the first amplified voltage at its output port. During the time period 435B, the pulses P0, P1, P5, P6, P5A, P8A may have a second state (e.g., logic state '0'), such that other switches SB0A-SB3A, SB0B-SB3B, S5, S6, S5A, S8A may be disabled.

During a first sub-time period 435B' within the time period 435B, the pulse P7 may have a first state (e.g., logic state '1') while the pulse P8 may have a second state (e.g., logic state '0'). In response to the pulse P7 having the first state (e.g., logic state '1'), the switches S7, S7A may be enabled to electrically couple the first electrode of the capacitor Cs2 to the reference metal rail 530 and electrically couple the second electrode of the capacitor Cs2 to the output port of the differential amplifier A1. In response to the pulse P8 having the second state (e.g., logic state '0'), the switch S8 may be disabled to electrically decouple the first electrode of the capacitor Cs2 from the output port of the differential amplifier A1. Accordingly, the capacitor Cs2 may store electrical charges corresponding to the first amplified voltage during the first sub-time period 435B'.

During a second sub-time period 435B" within the time period 435B, the pulse P8 may have a first state (e.g., logic state '1') while the pulse P7 may have a second state (e.g., logic state '0'). In response to the pulse P8 having the first state (e.g., logic state '1'), the switch S8 may be enabled to electrically couple the first electrode of the capacitor Cs2 to the output port of the differential amplifier A1. In response to the pulse P7 having the second state (e.g., logic state '0'), the switches S7, S7A may be disabled to electrically decouple the first electrode of the capacitor Cs2 from the reference metal rail 530 and electrically decouple the second electrode of the capacitor Cs2 from the output port of the differential amplifier A1. During the second sub-time period 435B", the switch S8A may be disabled to electrically decouple the second electrode of the capacitor Cs2 from the output metal rail, such that the second electrode of the capacitor Cs2 can be electrically floated. In one aspect, the first amplified voltage can be applied to the first electrode of the capacitor Cs2 during the second sub-time period 435B". Because the capacitor Cs2 maintains electrical charges corresponding to the first amplified voltage while the second electrode of the capacitor Cs2 is electrically floated, the voltage at the second electrode of the capacitor Cs2 can be increased to obtain the output voltage Vout during the second sub-time period 435B" through additional charge pump boosting. For example, the voltage at the second electrode of the capacitor Cs2 can be doubled during the second sub-time period 435B", such that the output voltage Vout at the second electrode of the capacitor Cs2 can be four times the input voltage Vin.

During a time period 445, the pulse P8A may have a first state (e.g., logic state '1'). In response to the pulse P8A having the first state, the second electrode of the capacitor Cs2 can be electrically coupled to the output metal rail. Meanwhile, the pulses P0, P1, P3, P5, P6, P5A, P6A, P4, P7, P8 may have a second state (e.g., logic state '0'), such that the switches SB0A-SB3A, SB0B-SB3B, S3, S5, S6, S5A, S6A, S4, S7, S7A, S8 can be disabled. Accordingly, the output voltage Vout can be provided to the ADC 250 through the output metal rail during the time period 445, and analog to digital conversion or other processes can be performed during the time period 445 according to the output voltage Vout.

Figure 7:
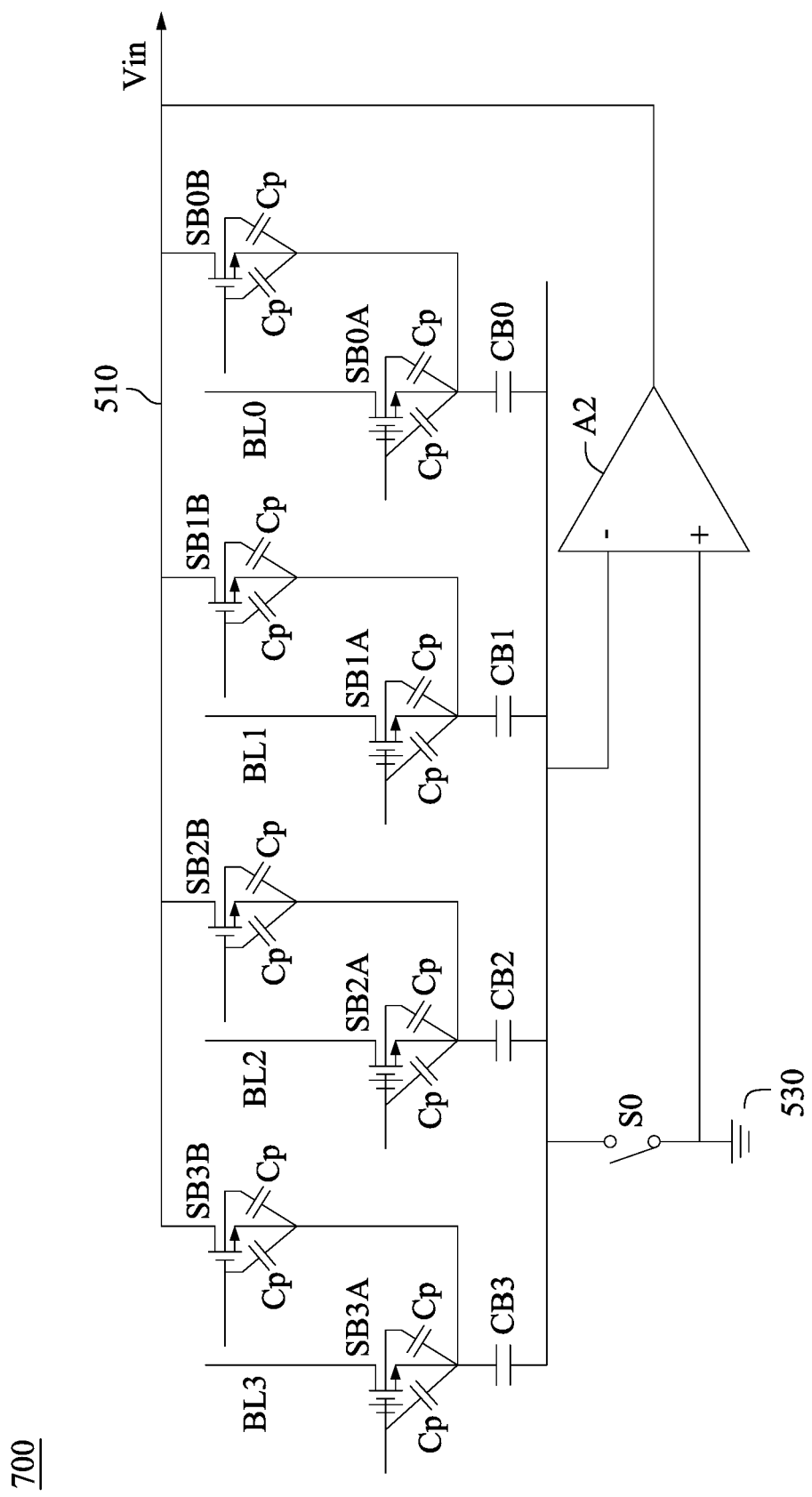
FIG. 7 is a circuit diagram showing an amplifier to reduce electrical charges due to parasitic capacitances of switches connected to computation capacitors, in accordance with one embodiment.

FIG. 7 is a circuit diagram 700 showing an amplifier A2 to reduce electrical charges due to parasitic capacitances of switches SB0A-SB3A connected to computation capacitors CB0-CB3, in accordance with one embodiment. In some embodiments, the switches SB0A-SB3A, SB0B-SB3B can be embodied transistors (e.g., N-type transistors). The switches SB0A-SB3A may have parasitic capacitances Cp. The parasitic capacitances Cp may store charges that may degrade linearity of the input voltage Vin at the common metal rail 510. In one configuration, a switch S0 and the amplifier A2 can be implemented to reduce electrical charges due to parasitic capacitances of the switches SB0A-SB3A.

In one configuration, a second electrode of each capacitor CBX is connected to a first electrode of a switch S0 and a first input port (e.g., "−" input port) of the amplifier A2, where a second electrode of the switch S0 is connected to the reference metal rail 530, at which the reference voltage (e.g., ground voltage) is provided. In one configuration, the second input port (e.g., "+" input port) of the amplifier A2 is connected to the reference metal rail 530, where the output port of the amplifier A2 is connected to the common metal rail 510. The switch S0 may be configured according to a voltage or a pulse from a controller (e.g., timing controller 110). For example, a pulse having a first state (e.g., logic state '1') is applied to a gate electrode of the switch S0 during the time period 415, where a pulse having a second state (e.g., logic state '0') is applied to the gate electrode of the switch S0 during the time period 425. In response to the pulse having the first state (e.g., logic state '1'), the switch S0 may be enabled to electrically couple the second electrodes of the capacitors CB0-CB3 to the reference metal rail 530. Accordingly, in response to the pulse having the first state, the first input port and the second input port of the amplifier A2 may be electrically coupled to the reference metal rail 530, such that the amplifier A2 may be disabled. In response to the pulse having the second state (e.g., logic state '0'), the switch S0 may be disabled to electrically decouple the second electrodes of the capacitors CB0-CB3 from the reference metal rail 530. When the first input port and the second input port of the amplifier A2 are decoupled from each other, the amplifier A2 may sense charges stored by parasitic capacitances of the switches SB0A-SB3A and adjust the input voltage Vin at the common metal rail 510 according to the sensed charges. By adjusting the input voltage Vin according to the charges stored by the parasitic capacitances, linearity of the input voltage Vin at the common metal rail 510 can be improved.

Figure 8:
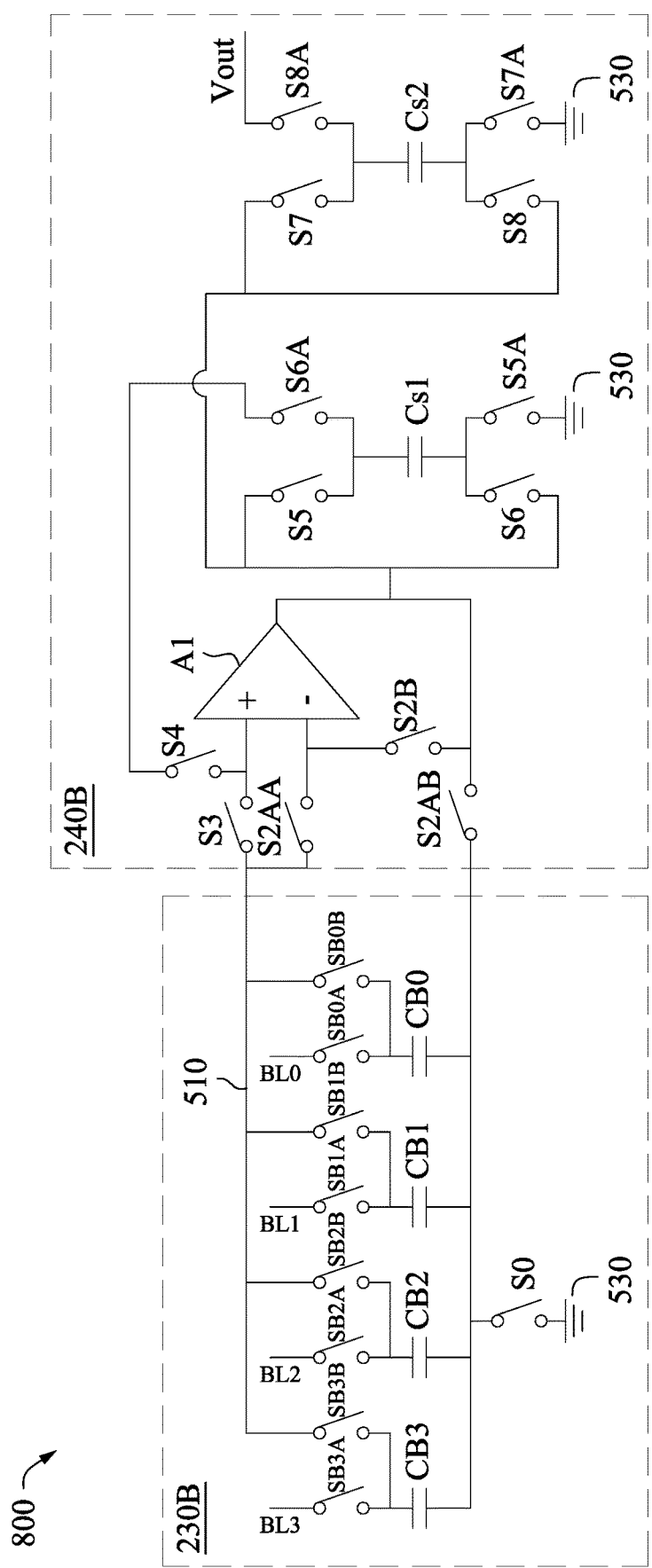
FIG. 8 is a circuit diagram showing a computation capacitor bank and a voltage amplifier, in accordance with one embodiment.

FIG. 8 is a circuit diagram 800 showing a computation capacitor bank 230B and a voltage amplifier 240B, in accordance with one embodiment. The configurations of the computation capacitor bank 230B and the voltage amplifier 240B are similar to the configuration of the computation capacitor bank 230A and the voltage amplifier 240A of FIG. 5, except the computation capacitor bank 230B includes the switch S0, and the voltage amplifier 240B includes switches S2AA, S2AB, S2B. The switches S0, S2AA, S2AB, S2B may be embodied as transistors or any components that can selectively couple two or more components. Thus, detailed description on duplicated portion thereof is omitted herein for the sake of brevity.

In one configuration, the switch S0 includes a first electrode connected to the reference metal rail 530, and a second electrode connected to the second electrodes of the capacitors CB0-CB3. In one configuration, the switch S2AB includes a first electrode connected to the second electrode of the switch S0 and a second electrode connected to the output port of the differential amplifier A1. In one configuration, the switch S2B includes a first electrode connected to i) the output port of the differential amplifier A1 and ii) the second input port (e.g., "−" input port) of the differential amplifier A1. In one configuration, the switch S2AA includes a first electrode connected to the common metal rail 510 and a second electrode connected to the second input port of the differential amplifier A1. In one aspect, the switches S0, S2AA, S2AB, S2B can be configured or operated according to voltages or pulses from a controller (e.g., timing controller 110) to reduce electrical charges stored by parasitic capacitances of the switches SB0A-SB3A. Example operations of the computation capacitor bank 230B and the voltage amplifier 240B are provided below with respect to FIG. 9.

Figure 9:
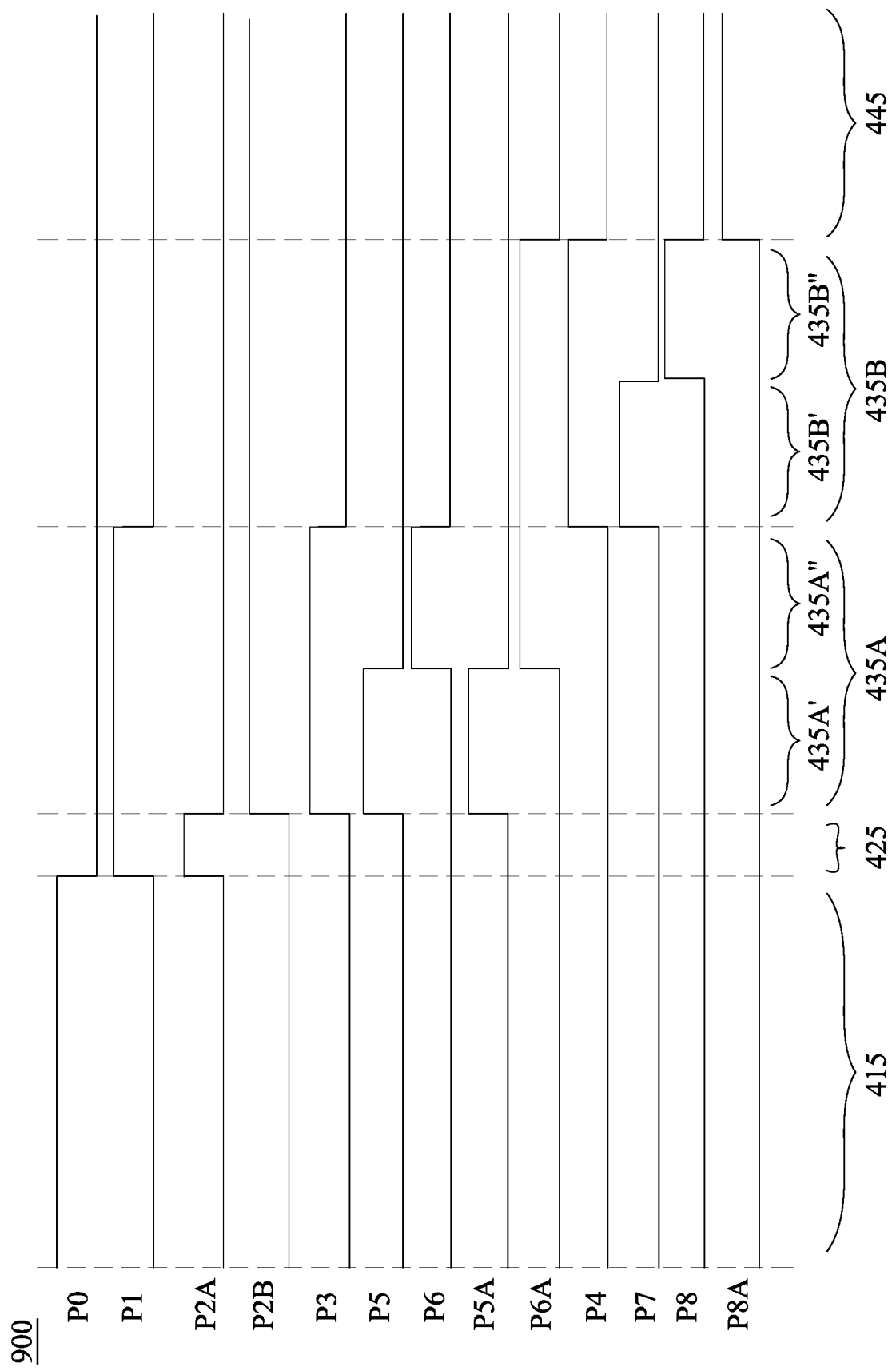
FIG. 9 is a timing diagram showing an example operation of a voltage amplifier, in accordance with one embodiment.

FIG. 9 is a timing diagram 900 showing an example operation of the computation capacitor bank 230B and the voltage amplifier 240B, in accordance with one embodiment. The timing diagram 900 is similar to the timing diagram 600 in FIG. 6, except pulses P2A, P2B are added. Thus, detailed description on duplicated portion thereof is omitted herein for the sake of brevity. In some embodiments, a controller (e.g., timing controller 110) generates the pulses P2A, P2B. The controller may provide the pulse P2A to gate electrodes of the switches S2AA, S2AB, and provide the pulse P2B to a gate electrode of the switch S2B. The controller may also provide the pulse P0 to a gate electrode of the switch S0. According to the pulses P0, P2A, P2B, the switches S0, S2AA, S2AB, S2B can be configured to reduce electrical charges due to parasitic capacitances of the switches SB0A-SB3A.

During the time period 415, the pulse P0 may have a first state (e.g., logic state '1'), while the pulses P2A, P2B may have a second state (e.g., logic state '0'). In response to the pulse P0 having the first state, the switch S0 may electrically couple the second electrodes of the capacitors CB0-CB3 to the reference metal rail 530. In response to the pulse P2A having the second state, the switch S2AA may electrically decouple the common metal rail 510 from the second input port of the differential amplifier A1 and the switch S2AB may electrically decouple the output port of the differential amplifier A1 from the second electrodes of the capacitors CB0-CB3. In response to the pulse P2B having the second state, the switch S2B may electrically decouple the second input port of the differential amplifier A1 from the output port of the differential amplifier A1. In one aspect, during the time period 415, the switch S0 is enabled such that the capacitors CB0-CB3 can sample voltages or currents corresponding to multi-bit data stored by the set of memory cells 125. In addition, during the time period 415, the switches S3, S4, S2AA, S2B, S2AB are disabled, such that no input is provided to the differential amplifier A1.

During the time period 425, the pulse P2A may have a first state (e.g., logic state '1'), while the pulses P0, P2B may have a second state (e.g., logic state '0'). In response to the pulse P2A having the first state, the switch S2AA may electrically couple the common metal rail 510 to the second input port of the differential amplifier A1 and the switch S2AB may electrically couple the output port of the differential amplifier A1 to the second electrodes of the capacitors CB0-CB3. In response to the pulse P0 having the second state, the switch S0 may electrically decouple the second electrodes of the capacitors CB0-CB3 from reference metal rail 530. In response to the pulse P2B having the second state, the switch S2B may electrically decouple the second input port of the differential amplifier A1 from the output port of the differential amplifier A1. In one aspect, during the time period 425, the switch S0 is disabled such that the second electrodes of the capacitors CB0-CB3 can be electrically floated during the charge sharing. In addition, during the time period 425, the amplifier A1 may reduce electrical charges stored by parasitic capacitances of the switches SB0A-SB3A from the shared electrical charges.

During the time period 435A, the pulse P2B may have a first state (e.g., logic state '1'), while the pulses P0, P2A may have a second state (e.g., logic state '0'). In response to the pulse P2B having the first state, the switch S2B may electrically couple the second input port of the differential amplifier A1 to the output port of the differential amplifier A1. In response to the pulse P0 having the second state, the switch S0 may electrically decouple the second electrodes of the capacitors CB0-CB3 from reference metal rail 530. In response to the pulse P2A having the second state, the switch S2AA may electrically decouple the common metal rail 510 from the second input port of the differential amplifier A1 and the switch S2AB may electrically decouple the output port of the differential amplifier A1 from the second electrodes of the capacitors CB0-CB3. In one aspect, during the time period 435A, the switch S2B is enabled and the switches S2AA, S2AB are disabled, such that the differential amplifier A1 can be arranged or operate as a unity gain buffer.

Advantageously, a single differential amplifier A1 can be adaptively arranged or configured to perform cascaded charge pump boosting and compensating for electrical charges due to parasitic capacitances. Accordingly, area efficiency can be achieved, because multiple amplifiers may not be implemented.

Figure 10:
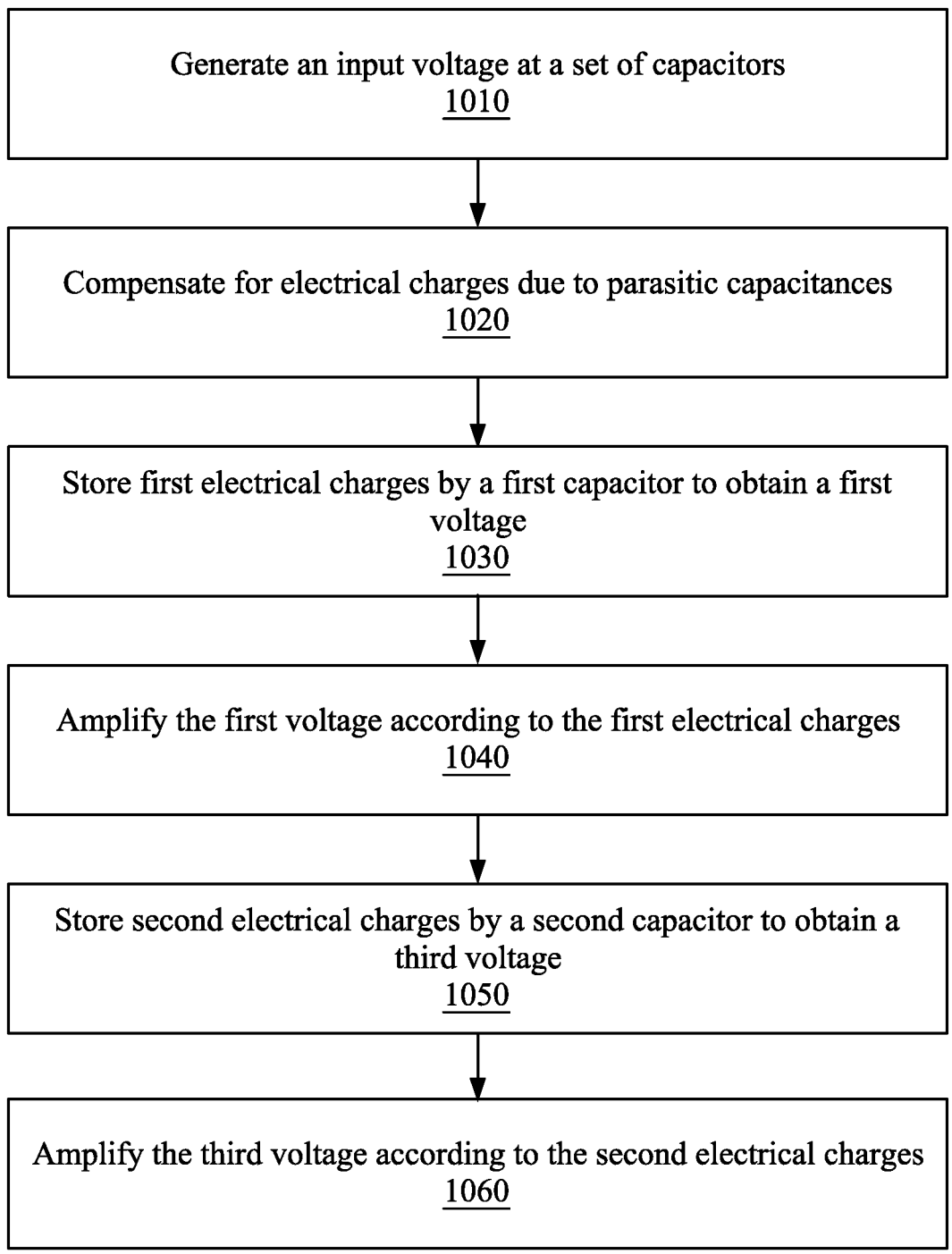
FIG. 10 is a flowchart of a method of amplifying a voltage of an input signal, in accordance with some embodiments.

FIG. 10 is a flowchart of a method 1000 of amplifying a voltage of an input signal, in accordance with some embodiments. The method 1000 may be performed by the bit line controller 112 of FIG. 1. In some embodiments, the method 1000 is performed by other entities (e.g., a voltage amplifier). In some embodiments, the method 1000 includes more, fewer, or different operations than shown in FIG. 10.

In an operation 1010, the bit line controller 112 generates an input voltage Vin at a set of capacitors (e.g., CB0 . . . CBN-1). In one approach, the capacitors of the computation capacitor bank 230 including the set of capacitors may sample voltages or currents corresponding to multi-bit data stored by a set of memory cells 125. Hence the capacitors of the computation capacitor bank 230 may store electrical charges corresponding to the sampled voltages or currents. In one aspect, capacitors of the computation capacitor bank 230 may have weighted capacitances. Accordingly, each capacitor of the computation capacitor bank 230 may store different amount of electrical charges according to its capacitance. The bit line controller 112 may generate or obtain the input voltage Vin through charge sharing. For example, the bit line controller 112 may configure or cause the set of capacitors (e.g., CB0 . . . CBN-1) of the computation capacitor bank 230 to share electrical charges. The amount of electrical charges collectively stored may indicate or correspond to multi-bit data stored. If a set of memory cells 125 stores data [1001], the set of capacitors may collectively store electrical charges corresponding to $9 \times C_{unit}$. If a set of memory cells 125 stores data [0011], the set of capacitors may collectively store electrical charges corresponding to $3 \times C_{unit}$. The input voltage Vin may correspond to the amount of electrical charges collectively stored, as shown in Eq. (1).

In an operation 1020, the bit line controller 112 compensates for electrical charges due to parasitic capacitances to obtain first electrical charges. The bit line controller 112 may implement an amplifier (e.g., differential amplifier A1) to reduce electrical charges stored by the parasitic capacitances of the switches (e.g., SB0A-SB3A). By compensating for electrical charges due to parasitic capacitances, a signal linearity can be improved.

In an operation 1030, the bit line controller 112 stores first electrical charges by a first capacitor (e.g., Cs1) to obtain a first voltage. For example, the differential amplifier A1 arranged as a unity gain buffer may receive the input voltage Vin at the first input port (e.g., "+" input port) from the set of capacitors (e.g., CB0 . . . CBN-1) of the computation capacitor bank 230, and generate or output the input voltage Vin at the output port. Meanwhile, the switches S5, S5A may be enabled, and the switches S6, S6A may be disabled, such that the reference voltage (e.g., ground voltage) is applied to the first electrode of the capacitor Cs1 and the input voltage Vin from the differential amplifier A1 is applied to the second electrode of the capacitor Cs1. Hence, the capacitor Cs1 can store the first electrical charges corresponding to the input voltage Vin.

In an operation 1040, the bit line controller 112 amplifies the first voltage according to the first electrical charges. In one approach, the bit line controller 112 amplifies the first voltage according to the first electrical charges through charge pump boosting. For example, the switches S5, S5A may be disabled and the switches S6, S6A may be enabled, such that the input voltage Vin from the differential amplifier A1 is applied to the first electrode of the capacitor Cs1 and the second electrode of the capacitor Cs1 is electrically floated. Because the capacitor Cs1 maintains the first electrical charges while the voltage at the first electrode of the capacitor Cs1 is increased to the input voltage Vin, the voltage at the second electrode can increase to obtain a first amplified voltage. The first amplified voltage at the second electrode of the capacitor Cs1 may be twice the input voltage Vin.

In an operation 1050, the bit line controller 112 stores second electrical charges by a second capacitor (e.g. Cs2) to obtain a third voltage. For example, the differential amplifier A1 is configured to receive the first amplified voltage from the first capacitor Cs1 at the first input port instead of the input voltage Vin from the set of capacitors (e.g., CB0 . . . CBN-1) of the computation capacitor bank 230, and generate or output the first amplified voltage at the output port. Meanwhile, the switches S7, S7A may be enabled, and the switches S8, S8A may be disabled, such that the reference voltage (e.g., ground voltage) is applied to the first electrode of the capacitor Cs2 and the first amplified voltage from the differential amplifier A1 is applied to the second electrode of the capacitor Cs2. Hence, the capacitor Cs2 can store the second electrical charges corresponding to the first amplified voltage. The capacitor Cs2 may have a third voltage (or the first amplified voltage) at the second electrode of the capacitor Cs2.

In an operation 1060, the bit line controller 112 amplifies the third voltage according to the second electrical charges. In one approach, the bit line controller 112 amplifies the third voltage according to the second electrical charges through additional charge pump boosting. For example, the switches S7, S7A, S8A may be disabled and the switches S8 may be enabled, such that the first amplified voltage from the differential amplifier A1 is applied to the first electrode of the capacitor Cs2 and the second electrode of the capacitor Cs2 is electrically floated. Because the capacitor Cs2 maintains the second electrical charges while the voltage at the first electrode of the capacitor Cs2 is increased to the first amplified voltage, the voltage at the second electrode can increase to obtain a second amplified voltage or the output voltage Vout. The output voltage at the second electrode of the capacitor Cs2 may be four times the input voltage Vin.

Beneficially, the voltage amplifier 240 can achieve several advantages. In one aspect, accurate voltage amplification can be achieved by implementing a differential amplifier, two capacitors and a set of switches. In one aspect, the voltage amplifier 240 can implement two capacitors for cascaded charge pump boosting, such that a large number of capacitors (e.g., three or more) for voltage amplification can be omitted. By reducing a number of capacitors implemented, an area efficiency can be achieved, and a SNR can be improved. Moreover, a single differential amplifier A1 can be adaptively arranged or configured to perform cascaded charge pump boosting and compensating for electrical charges due to parasitic capacitances, such that multiple amplifiers may not be implemented. In one aspect, the differential amplifier A1 is arranged to operate as a unity gain buffer having a simple configuration that may consume less power than a complex high gain amplifier (e.g., operation amplifier).

Figure 11:
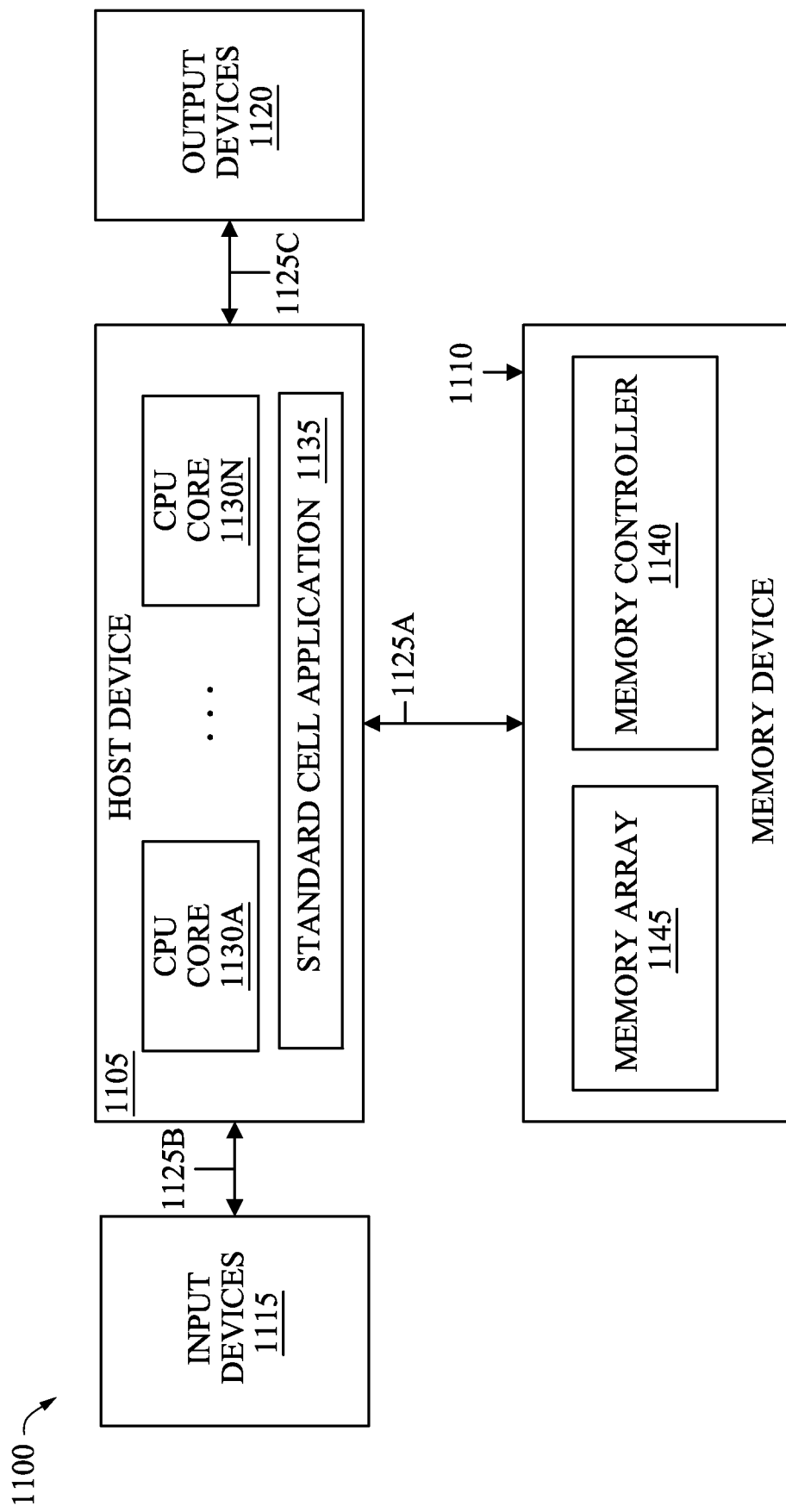
FIG. 11 is an example block diagram of a computing system, in accordance with some embodiments.

Referring now to FIG. 11, an example block diagram of a computing system 1100 is shown, in accordance with some embodiments of the disclosure. The computing system 1100 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1100 includes a host device 1105 associated with a memory device 1110. The host device 1105 may be configured to receive input from one or more input devices 1115 and provide output to one or more output devices 1120. The host device 1105 may be configured to communicate with the memory device 1110, the input devices 1115, and the output devices 1120 via appropriate interfaces 1125A, 1125B, and 1125C, respectively. The computing system 1100 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1105.

The input devices 1115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1105 and that allows an external source, such as a user (e.g., a circuit or layout designer), to enter information (e.g., data) into the host device and send instructions to the host device. Similarly, the output devices 1120 may include a variety of output technologies such as external memories, printers, speakers, displays, microphones, light emitting diodes, headphones, video devices, and any other output peripherals that are configured to receive information (e.g., data) from the host device 1105. The "data" that is either input into the host device 1105 and/or output from the host device may include any of a variety of textual data, circuit data, signal data, semiconductor device data, graphical data, combinations thereof, or other types of analog and/or digital data that is suitable for processing using the computing system 1100.

The host device 1105 includes or is associated with one or more processing units/processors, such as Central Processing Unit ("CPU") cores 1130A-1130N. The CPU cores 1130A-1130N may be implemented as an Application Specific Integrated Circuit ("ASIC"), Field Programmable Gate Array ("FPGA"), or any other type of processing unit. Each of the CPU cores 1130A-1130N may be configured to execute instructions for running one or more applications of the host device 1105. In some embodiments, the instructions and data to run the one or more applications may be stored within the memory device 1110. The host device 1105 may also be configured to store the results of running the one or more applications within the memory device 1110. Thus, the host device 1105 may be configured to request the memory device 1110 to perform a variety of operations. For example, the host device 1105 may request the memory device 1110 to read data, write data, update or delete data, and/or perform management or other operations. One such application that the host device 1105 may be configured to run may be a standard cell application 1135. The standard cell application 1135 may be part of a computer aided design or electronic design automation software suite that may be used by a user of the host device 1105 to use, create, or modify a standard cell of a circuit. In some embodiments, the instructions to execute or run the standard cell application 1135 may be stored within the memory device 1110. The standard cell application 1135 may be executed by one or more of the CPU cores 1130A-1130N using the instructions associated with the standard cell application from the memory device 1110. In one example, the standard cell application 1135 allows a user to utilize pre-generated schematic and/or layout designs of the memory system 100, a portion of the memory system 100, or the voltage amplifier 240 to aid integrated circuit design. After the layout design of the integrated circuit is complete, multiples of the integrated circuit, for example, including the memory system 100, a portion of the memory system 100, or the voltage amplifier 240 can be fabricated according to the layout design by a fabrication facility.

Referring still to FIG. 11, the memory device 1110 includes a memory controller 940 that is configured to read data from or write data to a memory array 1145. The memory array 1145 may include a variety of volatile and/or non-volatile memories. For example, in some embodiments, the memory array 1145 may include NAND flash memory cores. In other embodiments, the memory array 1145 may include NOR flash memory cores, SRAM cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1145 may be individually and independently controlled by the memory controller 1140. In other words, the memory controller 1140 may be configured to communicate with each memory within the memory array 1145 individually and independently. By communicating with the memory array 1145, the memory controller 1140 may be configured to read data from or write data to the memory array in response to instructions received from the host device 1105. Although shown as being part of the memory device 1110, in some embodiments, the memory controller 1140 may be part of the host device 1105 or part of another component of the computing system 1100 and associated with the memory device. The memory controller 1140 may be implemented as a logic circuit in either software, hardware, firmware, or combination thereof to perform the functions described herein. For example, in some embodiments, the memory controller 1140 may be configured to retrieve the instructions associated with the standard cell application 1135 stored in the memory array 1145 of the memory device 1110 upon receiving a request from the host device 1105.

It is to be understood that only some components of the computing system 1100 are shown and described in FIG. 11. However, the computing system 1100 may include other components such as various batteries and power sources, networking interfaces, routers, switches, external memory systems, controllers, etc. Generally speaking, the computing system 1100 may include any of a variety of hardware, software, and/or firmware components that are needed or considered desirable in performing the functions described herein. Similarly, the host device 1105, the input devices 1115, the output devices 1120, and the memory device 1110 including the memory controller 1140 and the memory array 1145 may include other hardware, software, and/or firmware components that are considered necessary or desirable in performing the functions described herein.

One aspect of this description relates to a voltage amplifier. In some embodiments, the voltage amplifier includes a first capacitor and a second capacitor. In some embodiments, the first capacitor includes a first electrode and a second electrode. In some embodiments, the second capacitor includes a second capacitor including a third electrode and a fourth electrode. In some embodiments, the voltage amplifier includes a differential amplifier including a first input port, a second input port, and an output port. In some embodiments, the second input port is coupled to the output port of the differential amplifier. In some embodiments, the voltage amplifier includes a first set of switches to selectively couple the first electrode of the first capacitor to i) the output port of the differential amplifier or ii) a reference metal rail. In some embodiments, the voltage amplifier includes a second set of switches to selectively couple the second electrode of first capacitor to i) the output port of the differential amplifier or ii) the first input port of the differential amplifier. In some embodiments, the voltage amplifier includes a third set of switches to selectively couple the third electrode of the second capacitor to i) the output port of the differential amplifier or ii) the reference metal rail. In some embodiments, the voltage amplifier includes a fourth set of switches to selectively couple the fourth electrode of second capacitor to i) the output port of the differential amplifier or ii) an input port of a device.

One aspect of this description relates to a method of amplifying an input voltage. In some embodiments, the method includes generating, at a set of capacitors, an input voltage corresponding to input data. In some embodiments, the method includes storing, by a first capacitor, first electrical charges corresponding to the input voltage. In some embodiments, the first capacitor has a first voltage at a first electrode of the first capacitor and a second voltage at a second electrode of the first capacitor according to the first electrical charges. In some embodiments, the method includes amplifying the second voltage at the second electrode of the first capacitor to obtain a third voltage by increasing the first voltage at the first electrode of the first capacitor according to the first electrical charges. In some embodiments, the method includes storing, by a second capacitor, second electrical charges corresponding to the third voltage, wherein the second capacitor has a fourth voltage at a third electrode of the second capacitor and the third voltage at a fourth electrode of the second capacitor according to the second electrical charges. In some embodiments, the method includes amplifying the third voltage at the fourth electrode of the second capacitor by increasing the fourth voltage at the third electrode of the second capacitor according to the second electrical charges.

One aspect of this description relates to a system. In some embodiments, the system includes a set of capacitors, and a voltage amplifier coupled to the set of capacitors. In some embodiments, the voltage amplifier includes a first capacitor, a second capacitor, and a set of switches. In some embodiments, the system includes a controller coupled to the voltage amplifier. In some embodiments, the controller causes the set of switches to generate an input voltage at the set of capacitors according to input data. In some embodiments, the controller causes the set of switches to store first electrical charges at the first capacitor according to the input voltage to obtain a second voltage. In some embodiments, the controller causes the set of switches to amplify the second voltage according to the first electrical charges stored by the first capacitor to obtain a third voltage. In some embodiments, the controller causes the set of switches to store second electrical charges at the second capacitor according to the third voltage. In some embodiments, the controller causes the set of switches to amplify the third voltage according to the second electrical charges stored by the second capacitor to obtain a fourth voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first capacitor including a first electrode and a second electrode;
a second capacitor including a third electrode and a fourth electrode;
a differential amplifier including a first input port, a second input port, and an output port, wherein the second input port is coupled to the output port of the differential amplifier;
a first set of switches coupled between the first electrode of the first capacitor and each of the output port of the differential amplifier and a reference metal rail, respectively;
a second set of switches coupled between the second electrode of the first capacitor and each of the output port of the differential amplifier and the first input port of the differential amplifier, respectively;
a third set of switches coupled between the third electrode of the second capacitor and each of the output port of the differential amplifier and the reference metal rail, respectively; and
a fourth set of switches coupled between the fourth electrode of the second capacitor and each of the output port of the differential amplifier and an input port of a device, respectively.

2. The circuit of claim 1, wherein the first set of switches includes:
a first switch is configured to selectively couple the first electrode of the first capacitor to the output port of the differential amplifier; and
a second switch is configured to selectively couple the first electrode of the first capacitor to the reference metal rail.

3. The circuit of claim 2, wherein the second set of switches includes:
a third switch is configured to selectively couple the second electrode of the first capacitor to the output port of the differential amplifier; and
a fourth switch coupled is configured to selectively couple the second electrode of the first capacitor to the first input port of the differential amplifier.

4. The circuit of claim 3, wherein the third set of switches includes:
a fifth switch is configured to selectively couple the third electrode of the second capacitor to the output port of the differential amplifier; and a sixth switch is configured to selectively couple the third electrode of the second capacitor to the reference metal rail.

5. The circuit of claim 4, wherein the fourth set of switches includes:
a seventh switch is configured to selectively couple the fourth electrode of the second capacitor to the output port of the differential amplifier; and
an eighth switch is configured to selectively couple the fourth electrode of the second capacitor to the input port of the device.

6. The circuit of claim 1, further comprising:
a fifth set of switches to selectively couple the first input port of the differential amplifier to i) a set of capacitors or ii) the second set of switches, respectively.

7. The circuit of claim 6, further comprising:
a controller coupled to the first set of switches, the second set of switches, the third set of switches, the fourth set of switches, and the fifth set of switches, wherein the controller is configured to:
cause the fifth set of switches to couple the first input port of the differential amplifier to the set of capacitors during a first time period,
cause the first set of switches to couple the first electrode of the first capacitor to the reference metal rail during a first sub-time period within the first time period, and
cause the second set of switches to couple the second electrode of the first capacitor to the output port of the differential amplifier during the first sub-time period.

8. The circuit of claim 7, wherein the controller is configured to:
cause the first set of switches to couple the first electrode of the first capacitor to the output port of the differential amplifier during a second sub-time period within the first time period, and
cause the second set of switches to couple the second electrode of the first capacitor to the fifth set of switches during the second sub-time period.

9. The circuit of claim 8, wherein the controller is configured to:
cause the fifth set of switches to couple the first input port of the differential amplifier to the second set of switches during a second time period after the first time period,
cause the third set of switches to couple the third electrode of the second capacitor to the reference metal rail during a third sub-time period within the second time period, and
cause the fourth set of switches to couple the fourth electrode of the second capacitor to the output port of the differential amplifier during the third sub-time period.

10. The circuit of claim 9, wherein the controller is configured to:
cause the third set of switches to couple the third electrode of the second capacitor to the output port of the differential amplifier during a fourth sub-time period within the second time period, and
cause the fourth set of switches to couple the fourth electrode of the second capacitor to the input port of the device during the fourth sub-time period.

11. The circuit of claim 1, wherein the device is a successive-approximation register (SAR) analog to digital converter (ADC), wherein the second capacitor is shared with the SAR ADC.

12. The circuit of claim 1, wherein the differential amplifier is a unity gain buffer.

13. A circuit, comprising:
a first capacitor including a first electrode and a second electrode;
a second capacitor including a third electrode and a fourth electrode; and
a differential amplifier including a first input port, a second input port, and an output port, wherein the second input port is coupled to the output port of the differential amplifier;
wherein the first electrode of the first capacitor is selectively coupled to the output port of the differential amplifier or a reference metal rail;
wherein the second electrode of the first capacitor is selectively coupled to the output port of the differential amplifier or the first input port of the differential amplifier;
wherein the third electrode of the second capacitor is selectively coupled to the output port of the differential amplifier or the reference metal rail; and
wherein the fourth electrode of the second capacitor is selectively coupled to the output port of the differential amplifier or an input port of a device.

14. The circuit of claim 13, further comprising:
a first switch coupled between the first electrode of the first capacitor and the output port of the differential amplifier; and
a second switch coupled between the first electrode of the first capacitor and the reference metal rail.

15. The circuit of claim 14, further comprising:
a third switch coupled between the second electrode of the first capacitor and the output port of the differential amplifier; and
a fourth switch coupled between the second electrode of the first capacitor and the first input port of the differential amplifier.

16. The circuit of claim 15, further comprising:
a fifth switch coupled between the third electrode of the second capacitor and the output port of the differential amplifier; and
a sixth switch coupled between the third electrode of the second capacitor and the reference metal rail.

17. The circuit of claim 16, further comprising:
a seventh switch coupled between the fourth electrode of the second capacitor and the output port of the differential amplifier; and
an eighth switch coupled between the fourth electrode of the second capacitor and the input port of the device.

18. The circuit of claim 13, wherein the device is a successive-approximation register (SAR) analog to digital converter (ADC), wherein the second capacitor is shared with the SAR ADC.

19. A circuit, comprising:
a first capacitor including a first electrode and a second electrode;
a second capacitor including a third electrode and a fourth electrode; and
a unity gain buffer including a first input port, a second input port, and an output port, wherein the second input port is coupled to the output port of the unity gain buffer;
wherein the first electrode of the first capacitor is selectively coupled to the output port of the unity gain buffer or a reference metal rail;
wherein the second electrode of the first capacitor is selectively coupled to the output port of the unity gain buffer or the first input port of the unity gain buffer;
wherein the third electrode of the second capacitor is selectively coupled to the output port of the unity gain buffer or the reference metal rail; and
wherein the fourth electrode of the second capacitor is selectively coupled to the output port of the unity gain buffer or an input port of a successive-approximation register (SAR) analog to digital converter (ADC).

20. The circuit of claim 19, wherein the second capacitor is shared with the SAR ADC.

* * * * *